(12) United States Patent
Kosaka

(10) Patent No.: US 8,350,550 B2
(45) Date of Patent: Jan. 8, 2013

(54) POWER UNIT USING COMPUTED FREQUENCY RATIO AND IMAGE FORMING APPARATUS

(75) Inventor: Toru Kosaka, Tokyo (JP)

(73) Assignee: Oki Data Corporation, Tokyo (JP)

( * ) Notice: Subject to any disclaimer, the term of this patent is extended or adjusted under 35 U.S.C. 154(b) by 330 days.

(21) Appl. No.: 12/861,975

(22) Filed: Aug. 24, 2010

(65) Prior Publication Data

US 2011/0051466 A1 Mar. 3, 2011

(30) Foreign Application Priority Data

Aug. 27, 2009 (JP) .................................. 2009-196698

(51) Int. Cl.
*G05F 1/00* (2006.01)

(52) U.S. Cl. ........................................................ 323/283

(58) Field of Classification Search .................. 323/282, 323/283; 363/16, 39, 40
See application file for complete search history.

(56) References Cited

U.S. PATENT DOCUMENTS

| | | | |
|---|---|---|---|
| 5,866,969 A * | 2/1999 | Shimada et al. | 310/318 |
| 5,923,542 A * | 7/1999 | Sasaki et al. | 363/16 |
| 5,923,546 A * | 7/1999 | Shimada et al. | 363/40 |
| 6,151,232 A * | 11/2000 | Furuhashi et al. | 363/97 |
| 6,903,517 B2 * | 6/2005 | Nakanishi et al. | 315/209 PZ |
| 7,403,405 B2 * | 7/2008 | Conte et al. | 363/59 |

FOREIGN PATENT DOCUMENTS

| | | | |
|---|---|---|---|
| JP | 2000-139081 A | 5/2000 | |
| JP | 2006-091757 A | 4/2006 | |

\* cited by examiner

*Primary Examiner* — Adolf Berhane
*Assistant Examiner* — Lakaisha Jackson
(74) *Attorney, Agent, or Firm* — Marvin A. Motsenbocker; Mots Law, PLLC

(57) ABSTRACT

A power unit includes: a frequency divider to divide a clock signal in a second frequency-division ratio based on a first frequency-division ratio and to output a driving pulse; a switching device driven by the driving pulse; a piezoelectric transformer to output an alternating-current high voltage when receiving an intermittent voltage from the switching device; a comparison device to compare a digital signal corresponding to the piezoelectric transformer output voltage with a target voltage and to output a comparison result; a controller to control the first frequency-division ratio based on the comparison result; a first holding device to hold the controlled first frequency-division ratio; a first computing device to determine the second frequency-division ratio by performing computation using a first correction value and the first frequency-division ratio held by the first holding device; and a second holding device to hold the second frequency-division ratio determined by the first computing device.

14 Claims, 14 Drawing Sheets

IMAGE FORMING APPARATUS OF EMBODIMENT 1

FIG. 7-1

I/O VALUES OF TABLE REGISTER 107-1 IN FIG. 6

| INPUT VALUE IN 5 bit | OUTPUT VALUE IN 8 bit |
|---|---|
| 00hex | C0hex |
| 01hex | A0hex |
| 02hex | 80hex |
| 03hex | 70hex |
| 04hex | 60hex |
| 05hex | 50hex |
| 06hex | 40hex |
| 07hex | 30hex |
| 08hex | 20hex |
| 09hex | 18hex |
| 0Ahex | 10hex |
| 0Bhex | 0Chex |
| 0Chex | 08hex |
| 0Dhex | 04hex |
| 0Ehex | 03hex |
| 0Fhex | 02hex |
| 10hex | 01hex |
| 11hex | 02hex |
| 12hex | 03hex |
| 13hex | 04hex |
| 14hex | 08hex |
| 15hex | 0Chex |
| 16hex | 10hex |
| 17hex | 18hex |
| 18hex | 20hex |
| 19hex | 28hex |
| 1Ahex | 30hex |
| 1Bhex | 40hex |
| 1Chex | 50hex |
| 1Dhex | 60hex |
| 1Ehex | 70hex |
| 1Fhex | 80hex |

FIG. 7-2

I/O VALUES OF TABLE REGISTER 107-2 IN FIG. 6

| INPUT VALUE IN 5 bit | OUTPUT VALUE IN 8 bit |
|---|---|
| 00hex | 80hex |
| 01hex | 80hex |
| 02hex | 80hex |
| 03hex | 80hex |
| 04hex | 80hex |
| 05hex | 80hex |
| 06hex | 80hex |
| 07hex | 80hex |
| 08hex | 80hex |
| 09hex | 80hex |
| 0Ahex | 80hex |
| 0Bhex | 80hex |
| 0Chex | 80hex |
| 0Dhex | 80hex |
| 0Ehex | 80hex |
| 0Fhex | 80hex |
| 10hex | 80hex |
| 11hex | 80hex |
| 12hex | 80hex |
| 13hex | 80hex |
| 14hex | 80hex |
| 15hex | 80hex |
| 16hex | 80hex |
| 17hex | 80hex |
| 18hex | 80hex |
| 19hex | 60hex |
| 1Ahex | 40hex |
| 1Bhex | 10hex |
| 1Chex | 01hex |
| 1Dhex | 01hex |
| 1Ehex | 01hex |
| 1Fhex | 01hex |

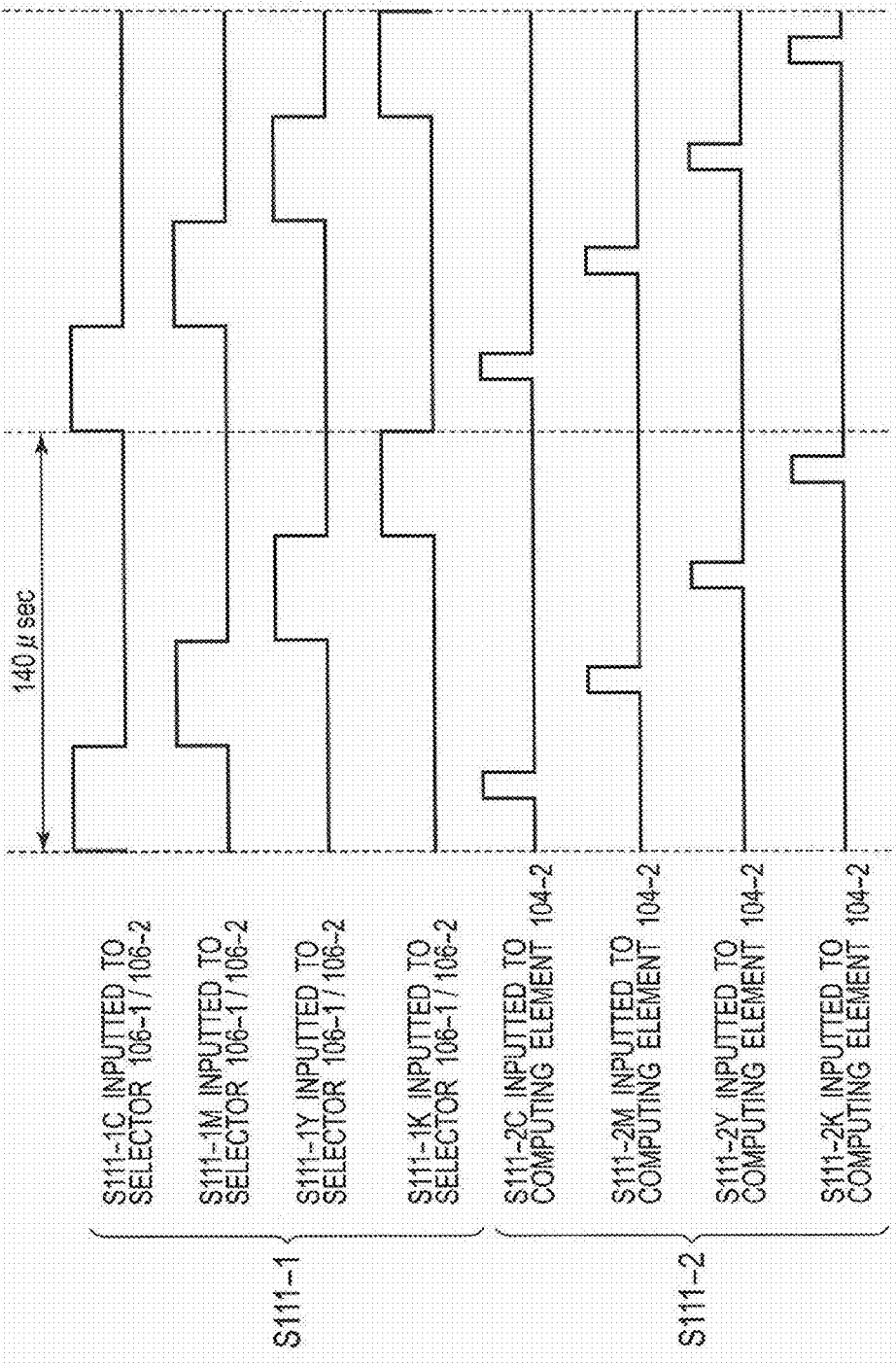

POWER UNIT USING COMPUTED FREQUENCY RATIO AND IMAGE FORMING APPARATUS

CROSS REFERENCE TO RELATED APPLICATIONS

This application claims priority based on 35 USC 119 from prior Japanese Patent Application No. P2009-196698 filed on Aug. 27, 2009, entitled "POWER UNIT AND IMAGE FORMING APPARATUS", the entire contents of which are incorporated herein by reference.

BACKGROUND OF THE INVENTION

1. Field of the Invention

The invention relates to a power unit using a piezoelectric transformer, and an electrophotographic image forming apparatus and the like using the power unit.

2. Description of the Related Art

As a power unit used for electro-photographic image forming apparatuses, as described for example in Japanese Patent Application Publication No. 2006-91757, there has conventionally been known an apparatus which includes a piezoelectric transformer capable of producing a high voltage from a low voltage input by use of a resonance phenomenon of a piezoelectric vibrator, and which is configured to control the piezoelectric transformer by using an output signal of a voltage control oscillator (hereinafter, referred to as a "VCO") so that the piezoelectric transformer outputs a high voltage.

However, the conventional power unit and an image forming apparatus using this power unit have problems (a) to (c) as below.

(a) The conventional power unit is formed of analog circuits such as a VCO. The piezoelectric transformers vary one to another in resonance frequency due to their production variation. Therefore, in the case of using a high output voltage in the vicinity of the resonance frequency in the piezoelectric transformer, a power unit needs to be equipped with components with different constants according to variation in the resonance frequency in order to correct the variation in the resonance frequency.

(b) In the case where the piezoelectric transformers having different sizes and different resonance frequencies are used, many of the constants of the VCOs and integrating circuits that form feedback circuits must be changed.

(c) There is a problem that the piezoelectric transformer becomes out of control when being controlled at a low frequency below the resonance frequency, and a high output voltage in the vicinity of the resonance frequency cannot be used.

SUMMARY OF THE INVENTION

A first aspect according to the invention is a power unit including: an oscillator configured to generate a clock signal; a frequency division device configured to divide the clock signal in a second frequency division ratio based on a first frequency division ratio and to output a driving pulse; a switching device driven by the driving pulse; a piezoelectric transformer configured to output an alternating-current high voltage from the secondary side thereof when a voltage is intermittently applied to the primary side thereof by the switching device; a converting device configured to convert the analog signal corresponding to the output voltage of the piezoelectric transformer into a digital signal and to output the digital signal; a comparison device configured to compare the digital signal with a target voltage set for the output voltage of the piezoelectric transformer and to output a comparison result; a controller configured to control the first frequency division ratio on the basis of the comparison result; a first frequency division ratio holding device configured to hold the first frequency division ratio controlled by the controller; a first computing device configured to determine the second frequency division ratio by performing computation using a first correction value and the first frequency division ratio held by the first frequency division ratio holding device; and a second frequency division ratio holding device configured to hold the second frequency division ratio determined by the first computing device.

A second aspect according to the invention is an image forming apparatus including the power unit according to the first aspect.

According to the power unit of the first aspect and the image forming apparatus of the second aspect, immediately before the piezoelectric transformer is driven, the frequency is shifted by the first computing device according to the first correction value. Thereby, without changing either components or logical circuits, a high voltage in the vicinity of the resonance frequency of the piezoelectric transformer can be output, and production variation of the piezoelectric transformer can be corrected. In addition, stable power control is achieved so that stable output is achieved irrespective of the environment, and a stable image without density level differences and a lateral stripe are obtained.

A third aspect according to the invention is a power unit including: an oscillator configured to generate a clock signal; a frequency division device configured to divide the clock signal in a second frequency division ratio based on a real-valued first frequency division ratio and to output a driving pulse; a switching device driven by the driving pulse; a piezoelectric transformer configured to output an alternating-current high voltage from the secondary side thereof when the voltage is intermittently applied to the primary side thereof by the switching device; a converting device configured to convert an analog signal corresponding to the output voltage of the piezoelectric transformer into a digital signal and to output the digital signal; a comparison device configured to compare the digital signal with a target voltage set for the output voltage of the piezoelectric transformer and to output a comparison result; a controller configured to control the first frequency division ratio on the basis of the comparison result; a first frequency division ratio holding device configured to hold the real-valued first frequency division ratio controlled by the controller; a first computing device configured to determine a third frequency division ratio by multiplying or dividing the real-valued first frequency division ratio held by the first frequency division ratio holding device by a first correction value; a binarizing device configured to determine an integer-valued frequency division ratio by binarizing the third frequency division ratio; and a second computing device configured to determine the second frequency division ratio by adding or subtracting the second correction value to or from the integer-valued division ratio.

A fourth aspect according to the invention is an image forming apparatus including the power unit according to the third aspect.

According to the power unit of the third aspect and the image forming apparatus of the fourth aspect, in substantially the same manner as the first aspect and the second aspect, immediately before the piezoelectric transformer is driven, the frequency is shifted by the second computing device according to the second correction value. Thereby, without changing either components or logical circuits, a high voltage in the vicinity of the resonance frequency of the piezoelectric transformer can be output, and production variation of the piezoelectric transformer can be corrected. In addition, stable power control is achieved so that stable output is achieved irrespective of the environment, and a stable image without density level differences and a lateral stripe can be obtained.

Furthermore, according to the third and fourth aspects, the configuration is such that the frequency to drive multiple piezoelectric transformers can be changed with magnification. Accordingly, in the case of using the multiple piezoelectric transformers having production variation and also differing from each other in size and frequency characteristics, by using a common logical circuit and properly selecting an optimal correction value, a high output voltage in the vicinity of the resonance frequency and output starting in a short time are possible simultaneously.

BRIEF DESCRIPTION OF THE DRAWINGS

FIG. 7-1 is a table showing I/O values in table register 107-1 in FIG. 6;

FIG. 7-2 is a table showing I/O values in table register 107-2 in FIG. 6;

FIG. 8 is a timing chart showing output pulses S111-1 and S111-2 of timer 111 in FIG. 6;

DETAILED DESCRIPTION OF EMBODIMENTS

Figure 1:
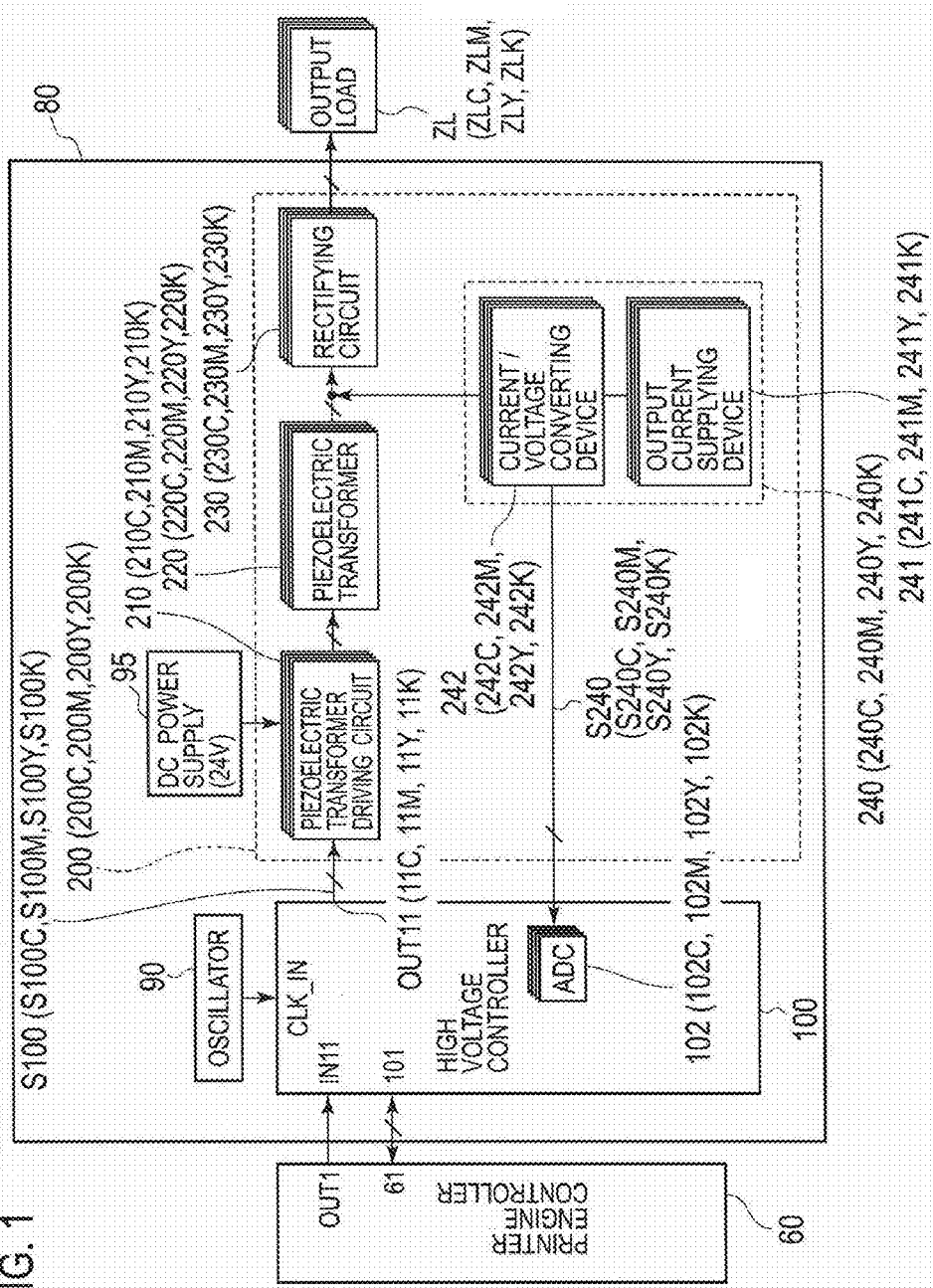
FIG. 1 is a block diagram schematically showing a power unit according to a first embodiment of the invention.

Descriptions are provided herein below for embodiments based on the drawings. In the respective drawings referenced herein, the same constituents are designated by the same reference numerals and duplicate explanation concerning the same constituents is omitted. All of the drawings are provided to illustrate the respective examples only.

First Embodiment

Configuration of Image Forming Apparatus

Figure 3:
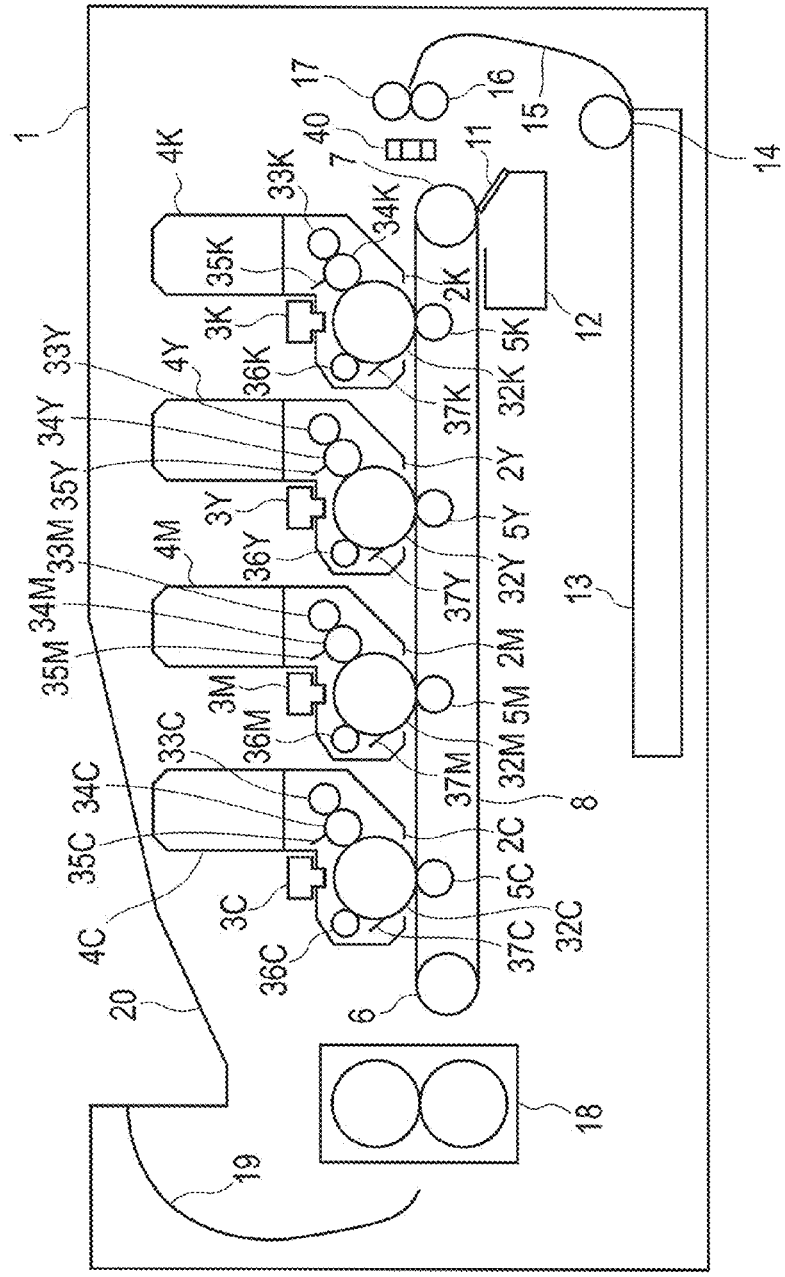
FIG. 3 is a configuration diagram showing an image forming apparatus using power unit 80 according to the first embodiment of the invention.

FIG. 3 is a configuration diagram showing an image forming apparatus using a power unit according to a first embodiment of the invention.

This image forming apparatus 1 is, for example, an electrophotographic color image forming apparatus, and developing units 2 of four colors (for example, four channels of black developing unit 2K, yellow developing unit 2Y, magenta developing unit 2M, and cyan developing unit 2C) are mounted to image forming apparatus 1 so as to be attachable and detachable. Developing units 2 (=2K, 2Y, 2M, 2C) of the respective colors (namely, the respective channels) are uniformly charged by charging rollers 36 (=36K, 36Y, 36M, 36C) which are in contact with photoreceptor drums 32 (~32K, 32Y, 32M, 32C). On charged photoreceptor drums 32, respective latent images are formed by light emitted from heads 3 (=3K, 3Y, 3M, 3C) of light emitting elements (hereinafter, referred to as "LEDs").

Feed rollers 33 (=33K, 33Y, 33M, 33C) in developing units 2 are configured to supply toners to developing rollers 34 (–34K, 34Y, 34M, 34C). By development blades 35 (=35K, 35Y, 35M, 35C), toner layers are uniformly formed on the surfaces of developing rollers 34. Toner images are thus developed on photoreceptor drums 32. Cleaning blades 37 (=37K, 37Y, 37M, 37C) in developing units 2 are configured to clean the remaining toners after transfer.

Toner cartridges 4 (=4K, 4Y, 4M, 4C) are detachably attached to developing units 2, and have structures which permit the toners therein to be supplied to developing units 2. Transfer rollers 5 (=5K, 5Y, 5M, 5C) are disposed in such a way that biases can be applied respectively to transfer nips from the rear surface of transfer belt 8. Transfer belt 8 is extended between transfer belt driving roller 6 and transfer belt following roller 7, and transfer belt driving roller 6 and transfer belt following roller 7 have a structure in which sheet 15 can be conveyed by drive of the rollers.

Transfer belt cleaning blade 11 is configured to scrape off the toners on transfer belt 8, and the scraped toners are accommodated in transfer belt cleaner container 12. Sheet cassette 13 is detachably attached to image forming apparatus 1, and sheets 15 as a transfer medium are loaded therein. Feeding roller 14 is configured to convey sheet 15 from sheet cassette 13. Registration rollers 16 and 17 are configured to convey sheet 15 to transfer belt 8 at a predetermined timing. Fixing unit 18 is configured to fix the toner images on sheet 15 through application of heat and pressure. Sheet guide 19 discharges sheet 15 face down to sheet discharging tray 20.

Sheet detection sensor 40 is disposed between registration rollers 16 and 17 and transfer belt following roller 7. Sheet detection sensor 40 is configured to detect passage of sheet 15 either in a contact or noncontact manner. Timing of applying a transfer bias by the power unit at the time of transfer is determined based on time determined from a relationship between the distance from the sensor position of this sheet detection sensor 40 to the transfer nip and the sheet transport speed.

Figure 4:
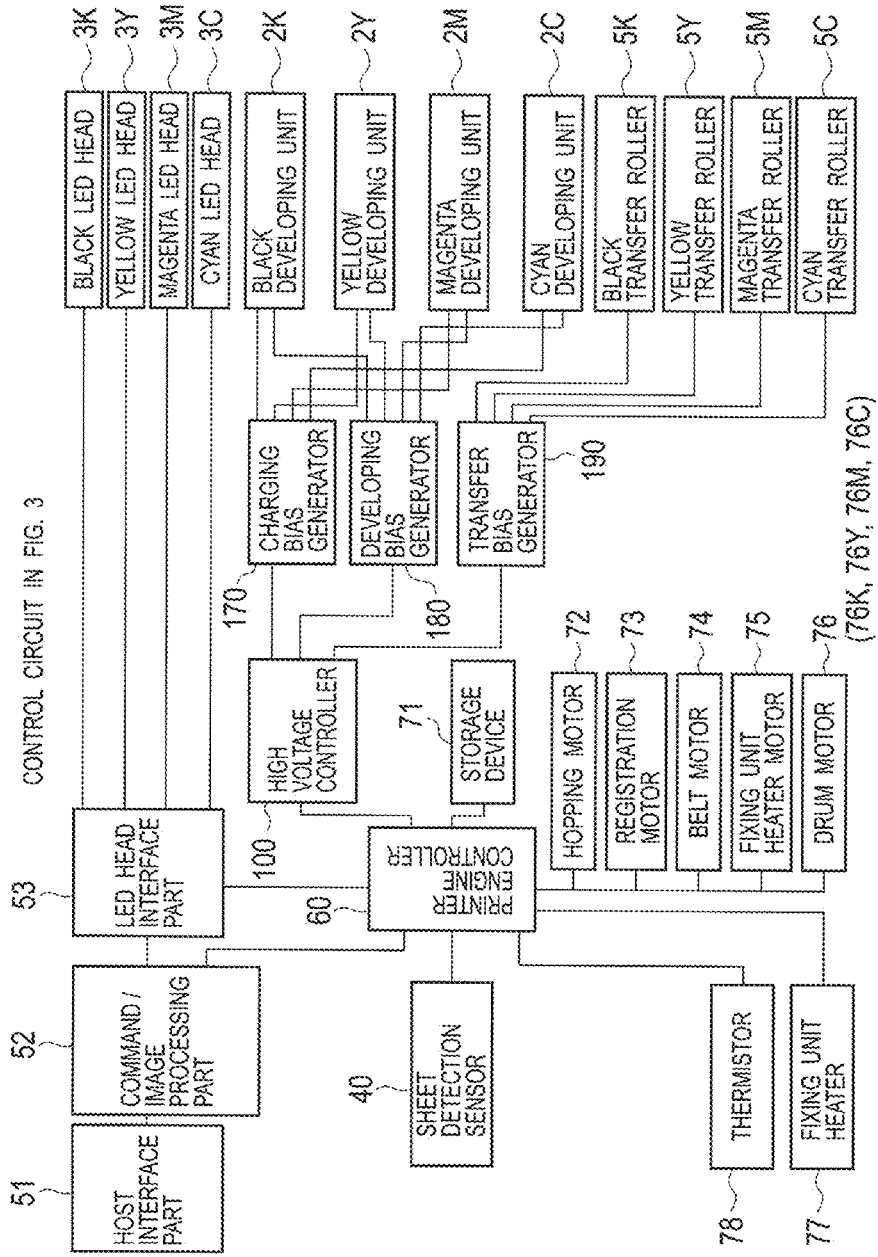
FIG. 4 is a block diagram showing a configuration of a control circuit in image forming apparatus 1 in FIG. 3.

FIG. 4 is a block diagram showing a configuration of a control circuit in image forming apparatus 1 in FIG. 3.

This control circuit has host interface part 51, and this host interface part 51 is configured to transmit and receive data to and from command/image processor 52. Command/image processor 52 is configured to output image data to LED head interface part 53. In LED head interface part 53, a head driving pulse and the like are controlled by printer engine controller 60 to thereby cause LED heads 3 of the channels (=3K, 3Y, 3M, 3C) to emit light.

Printer engine controller 60 is configured to send control values for a charging bias, a developing bias, a transfer bias, and the like to high voltage controller 100 based on the detection result of sheet detection sensor 40. High voltage controller 100 is configured to send signals to charging bias generator 170, developing bias generator 180, and transfer bias generator 190. Charging bias generator 170 and developing bias generator 180 are configured to apply biases to charging rollers 36 (=36K, 36Y, 36M, 36C) and developing rollers 34 (=34K, 34Y, 34M, 34C) in developing units 2 (=2K, 2Y, 2M, 2C). Transfer bias generator 190 is configured to apply transfer biases to transfer rollers 5 (=5K, 5Y, 5M, 5C). Sheet detection sensor 40 is used to adjust the timing of generating the transfer biases.

Based on information stored in storing device 71, printer engine controller 60 is also configured to drive feeding motor 72, registration motor 73, belt motor 74, fixing unit heater motor 75, and drum motors 76 (=76K, 76Y, 76M, 76C) at predetermined times. According to the detection value of thermistor 78, the temperature of the fixing unit heater 77 is controlled by printer engine controller 60.

(Configuration of Power Unit)

FIG. 1 is a block diagram schematically showing the power unit according to the first embodiment of the invention.

Printer engine controller 60, which is a target value setting device to set a target voltage for high voltage output, includes output port OUT1 that outputs reset signal RESET, serial communication device 61, and the like. Power unit 80 of the first embodiment is connected to output port OUT1 and serial communication device 61.

Power unit 80 of the first embodiment is comprised of high voltage controller 100 and transfer bias generator 190 in FIG. 4, for example, and is a unit that generates a high DC voltage upon receipt of reset signal RESET as a control signal supplied from output port OUT1 of printer engine controller 60 and a control signal supplied from serial communication device 61, and that supplies the transfer biases to transfer rollers 5 of the respective colors (=5C, 5M, 5Y, 5K) serving as output loads ZL (=ZLC, ZLM, ZLY, ZLK), of transfer four channels of cyan (C), magenta (M), yellow (Y), and black (K). In FIG. 1, blocks juxtaposed are shown in piles for the four transfer channels whereas a portion shared by the multiple channels is shown as one block.

Power unit 80 includes oscillator 90 configured to generate reference clock (hereinafter, simply referred to as a "clock") CLK of a constant frequency (for example, 50 MHz) common to the channels, and DC power supply 95 configured to supply DC 24 V common to the channels. High voltage controller 100 common to the channels is connected to the output side of oscillator 90. Piezoelectric transformer high voltage circuits 200 of the channels (=200C, 200M, 200Y, 200K) are connected to the output side of DC power supply 95 and of high voltage controller 100.

High voltage controller 100 for each channel is a circuit configured to divide clock CLK supplied from oscillator 90 based on the control signal supplied from printer engine controller 60, and to output piezoelectric transformer driving pulses (hereinafter, simply referred to as "driving pulses") S100 (=S100C, S100M, S100Y, S100K). High voltage controller 100 includes clock input port CLK_IN that receives clock CLK; reset input port IN11 that receives reset signal RESET output from output port OUT1 of printer engine controller 60; serial communication device 101 connected to serial communication device 61 of printer engine controller 60; output ports OUT11 that output driving pulses S100 (=OUT11C, OUT11M, OUT11Y, OUT11K) analog/digital converters 102 (=102C, 102M, 102Y, 102K) (hereinafter, referred to as "ADCs") that are converting devices to detect analog output voltages 8240 (=S240C, S240M, S240Y, S240K) to be input, and to convert analog output voltages S240 into digital signals; and the like. ADC 102 of each channel has a resolution of 12 bits, for example.

High voltage controller 100 for the channels is comprised, for example, of: an application specific integrated circuit (hereinafter, referred to as an "ASIC") that is an integrated circuit in which circuits with multiple functions are integrated into one for a particular application; a microprocessor having a built-in central processing unit (hereinafter, referred to as a "CPU"); a field programmable gate array, i.e., a kind of a gate array, (hereinafter, referred to as a "FPGA") to which a user can write an original logical program; or the like.

Piezoelectric transformer high voltage circuits 200 (=200C, 200M, 200Y, 200K) include: piezoelectric transformer drive circuits 210 (=210C, 210M, 210Y, 210K) as switching devices connected to output nodes OUT11 of high voltage controller 100 for the four channels and the output side of DC power supply 95; piezoelectric transformers 220 of the four channels (=220C, 220M, 220Y, 220K); rectifying circuits 230 (=230C, 230M, 230Y, 230K) as rectifying devices; and output voltage supplying devices 240 (=240C, 240M, 240Y, 240K).

Piezoelectric transformer drive circuits 210 are circuits configured to output drive voltages by using switching elements based on driving pulses S100 output from output nodes OUT11 in high voltage controller 100 and DC 24 V supplied from DC power supply 95. Piezoelectric transformers 220 are connected to the output side of piezoelectric transformer drive circuits 210. Piezoelectric transformers 220 are transformers configured to boost the drive voltages by using the resonance phenomenon of a ceramic piezoelectric resonator or the like, to thereby output AC high voltages. Rectifying circuit 230 and output voltage supplying device 240 are connected to the output side of piezoelectric transformer 220.

Rectifying circuits 230 are circuits configured to convert the high AC voltages output from piezoelectric transformers 220 into high DC voltages, and to supply the high DC voltage to output loads ZL. Output voltage supplying devices 240 respectively comprise: output current supplying devices 241 (=241C, 241M, 241Y, 241K) configured to supply output currents to rectifying circuits 230; and current/voltage converting devices 242 (=242C, 242M, 242Y, 242K) configured to convert the output currents into output voltages S240 (=S240C, S240M, S240Y, S240K), and to output output voltages S240 to ADCs 102.

Although provided within power unit 80, high voltage controller 100 may be provided in a large-scale integrated circuit (hereinafter, referred to as an "LSI") in printer engine controller 60.

Figure 2:
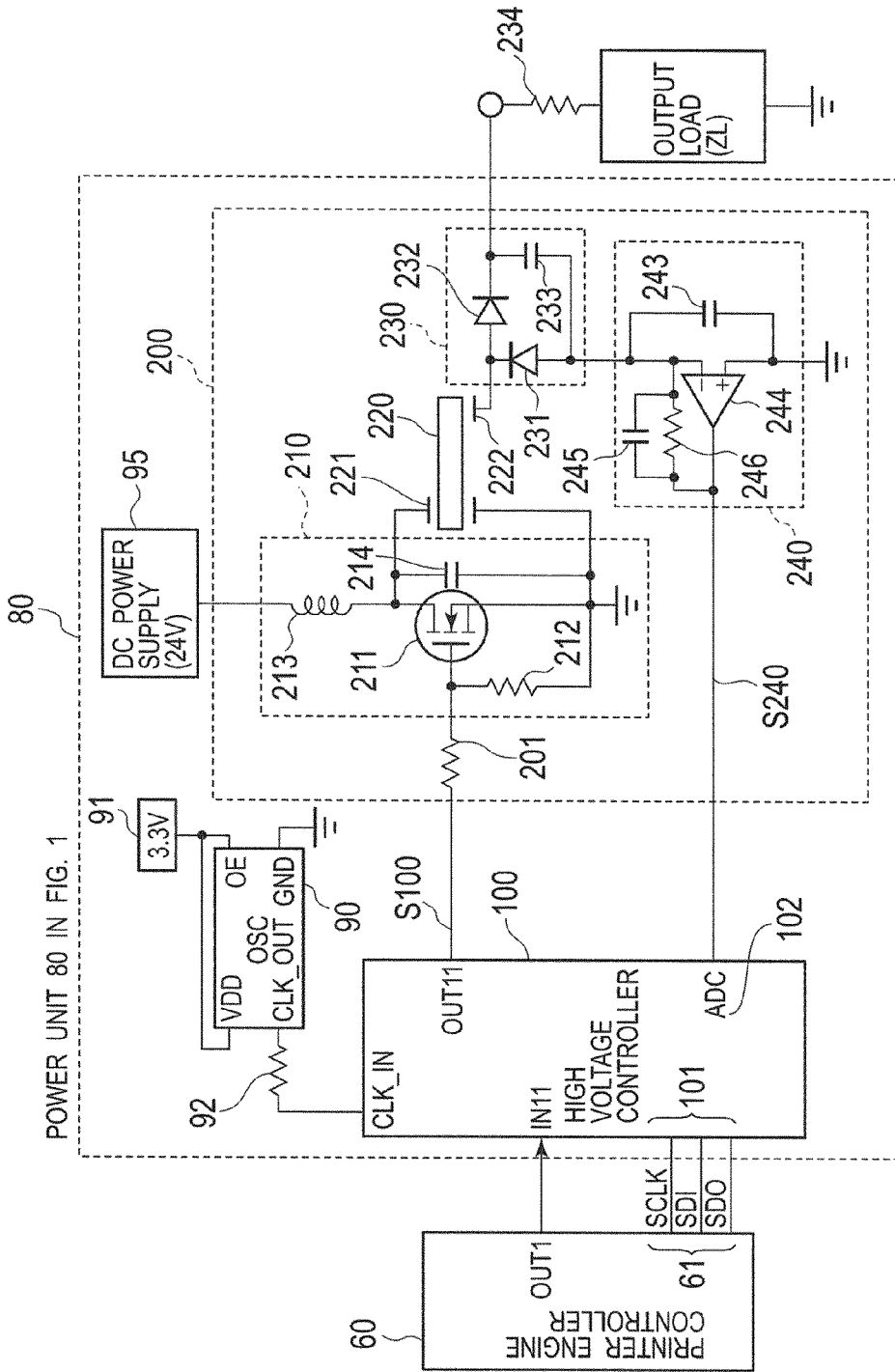
FIG. 2 is a circuit diagram showing an example of a detailed configuration in power unit 80 in FIG. 1.
Figure 5:
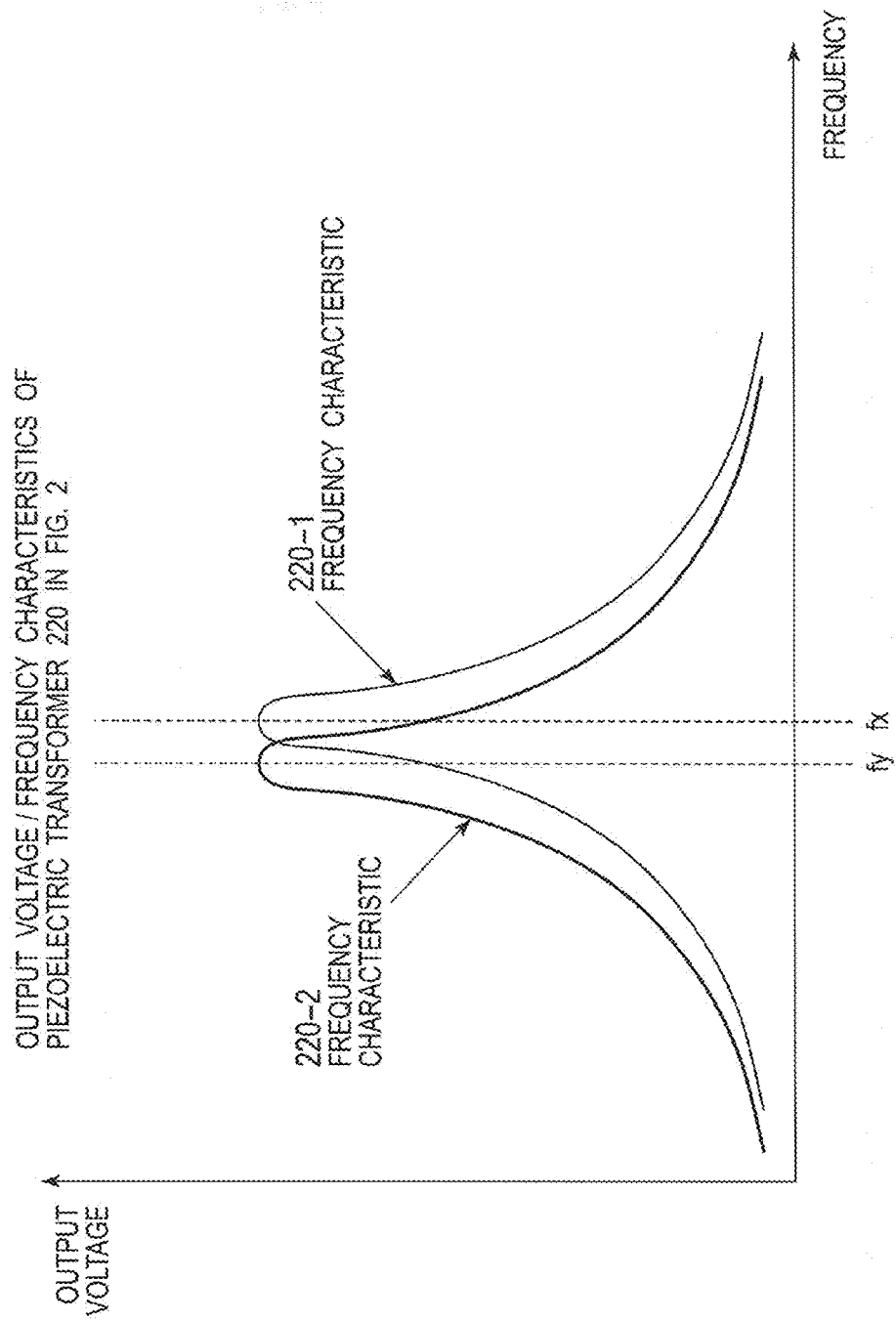
FIG. 5 is an output voltage/frequency characteristic chart of piezoelectric transformer 220 in FIG. 2.

FIG. 2 is a circuit diagram showing an example of a detailed configuration in power unit 80 in FIG. 1. FIG. 5 is an output voltage/frequency characteristic chart of piezoelectric transformer 220 in FIG. 2.

In FIG. 2, for simple description, in high voltage controller 100, output port OUT11 of one channel among the output ports of the four channels OUT11C, OUT11M, OUT11Y, and OUT11K, and ADC 102 of the one channel among ADCs of the four channels 102C, 102M, 102Y, and 102K are shown. Further, piezoelectric transformer high voltage circuit 200 of the one channel among piezoelectric transformer high voltage circuits 200C, 200M, 200Y, and 200K of the four channels, which have the same circuit configuration, is shown.

As shown in FIG. 2, serial communication device 61 of printer engine controller 60 is connected to serial communication device 101 of high voltage controller 100 with three signal lines (for example, SCLK line, SDI line, and SDO line).

The SCLK line is a signal line for serial clock SCLK that outputs a clock cycled to later-described transferred data from printer engine controller 60 to high voltage controller 100.

The SDI line is a signal line for a serial data input signal SDI that inputs data into high voltage controller 100, and is a signal line that transmits data to high voltage controller 100 from printer engine controller 60 in synchronization with serial clock SCLK. Further, the SDO line is a single line for serial data output signal SDO output from high voltage controller 100 in synchronization with serial clock SCLK, and is a signal line that transmits data in synchronization with serial clock SCLK.

Serial communication of this three-line system is well known, and details thereof are omitted. Because the accuracy of ON/OFF timing of high voltage output in image forming apparatus 1 is the order of a msec, a communication speed of the order of a μsec according to serial communication is no problem.

Oscillator 90 that supplies clock CLK to high voltage controller 100 is a circuit that operates at DC 3.3 V supplied from power supply 91, and generates clock CLK at an oscillating frequency of 50 MHz. Oscillator 90 has power supply terminal VDD to which DC 3.3 V is applied, output enable terminal OE to which DC 3.3 V is applied, output clock terminal CLK_OUT that outputs clock CLK, and ground terminal GND. Output clock terminal CLK_OUT is connected to clock input port CLK_IN of high voltage controller 100 through resistance 92.

In high voltage controller 100 that operates in synchronization with clock CLK, piezoelectric transformer drive circuit 210 is connected to output port OUT11 that outputs driving pulse S100 through resistance 201 in piezoelectric transformer high voltage circuit 200. DC power supply 95 is connected to this piezoelectric transformer drive circuit 210. DC power supply 95 is a commercially-available power supply of DC 24 V supplied from an unillustrated low voltage power supplying device by transforming and rectifying AC 100 V, for example.

Piezoelectric transformer drive circuit 210 has power transistor (e.g., N channel power MOSFET (hereinafter, "NMOS")) 211 as a switching element. Between the gate and source of this NMOS 211, resistance 212 for preventing short circuit is connected. The drain of NMOS 211 is connected to DC power supply 95 of DC 24 V through inductor (coil) 213. Between the drain and source of NMOS 211, capacitor 214 is connected in parallel, and a resonance circuit is formed of capacitor 214 and inductor 213. When driving pulse S100 from high voltage controller 100 is input into the gate of NMOS 211, DC 24 V is switched by this NMOS 211. This is resonated by the resonance circuit, so that a drive voltage of a half sine wave whose peak is approximately AC 100 V is output.

Input terminal 221 of the primary side of piezoelectric transformer 220 is connected to the output side of the resonance circuit, and an AC high voltage of 0 to several kV is output from the secondary side of output terminal 222 according to the switching frequency of NMOS 211. As shown in FIG. 5, the output voltage characteristics of the secondary side of output terminal 222 change with the frequency, and a boost ratio is determined by the switching frequency of NMOS 211.

Specifically, the output voltage/frequency characteristics of piezoelectric transformer 220 are as shown in FIG. 5, and the output voltage has a local maximum value at a frequency fx in a case of one piezoelectric transformer 220-1 whereas the output voltage has a local maximum value at a frequency fy in a case of different piezoelectric transformer 220-2. Thus, piezoelectric transformers 220-1 and 220-2 have different frequency characteristics due to production variation. This is because piezoelectric transformers 220 vary in size at the time of their production, and the range of the variation is approximately ±4% in terms of frequency. In the configuration of the first embodiment, the output voltage is controlled by driving piezoelectric transformer 220 at a high frequency having the characteristics on the right side of FIG. 5 and by reducing the drive frequency to raise the output voltage. Thereby, the output current is increased to obtain a target output current.

Rectifying circuit 230 for AC/DC conversion is connected to output terminal 222 of the secondary side of piezoelectric transformer 220. Rectifying circuit 230 is a circuit configured to convert the AC high voltage output from output terminal 222 of the secondary side of piezoelectric transformer 220 into the DC high voltage to output the DC high voltage, and is formed of diodes 231 and 232 and capacitor 233. Transfer roller 5 which is output load ZL is connected to the output side of rectifying circuit 230 through resistance 234.

Output voltage supplying device 240 comprises capacitors 243 and 245, operational amplifier (hereinafter, an "op-amp") 244 to which a power supply voltage of DC 24 V from DC power supply 95 is applied, and resistance 246. A "+" input terminal of op-amp 244 is grounded. A "−" input terminal of op-amp 244 is connected to an anode of diode 231 and capacitor 233 in rectifying circuit 230. Between the "+" input terminal and the "−" input terminal, capacitor 243 for smoothing an op-amp output is connected. Resistance 246 is connected between the "−" input terminal and the output terminal of op-amp 244. Capacitor 245 for smoothing an op-amp output is connected in parallel to resistance 246.

The current output from the output terminal of op-amp 244 is supplied to the anode of diode 231 in rectifying circuit 230 through resistance 246. Because the "+" input terminal of op-amp 244 is grounded, the voltage level of the "−" input terminal is 0 V, and therefore the output signal of op-amp 244 has a voltage corresponding to the current that flows into rectifying circuit 230. For example, in the case where the resistance value of resistance 246 is 33 kΩ and the current supplied to rectifying circuit 230 from op-amp 244 is 10 μA, output voltage S240 of op-amp 244 is 0.33 V. For that reason, op-amp 244 outputs a voltage corresponding to the current output by driving piezoelectric transformer 220 by piezoelectric transformer drive circuit 210, to ADC 102 in high voltage controller 100. For example, in the case where resistance 246 is 33 kΩ mentioned above, op-amp 244 outputs output voltage S240 of 0 to 3.3 V for the output current of 0 to 100 μA.

(Configuration of Controller in Power Unit)

Figure 6:
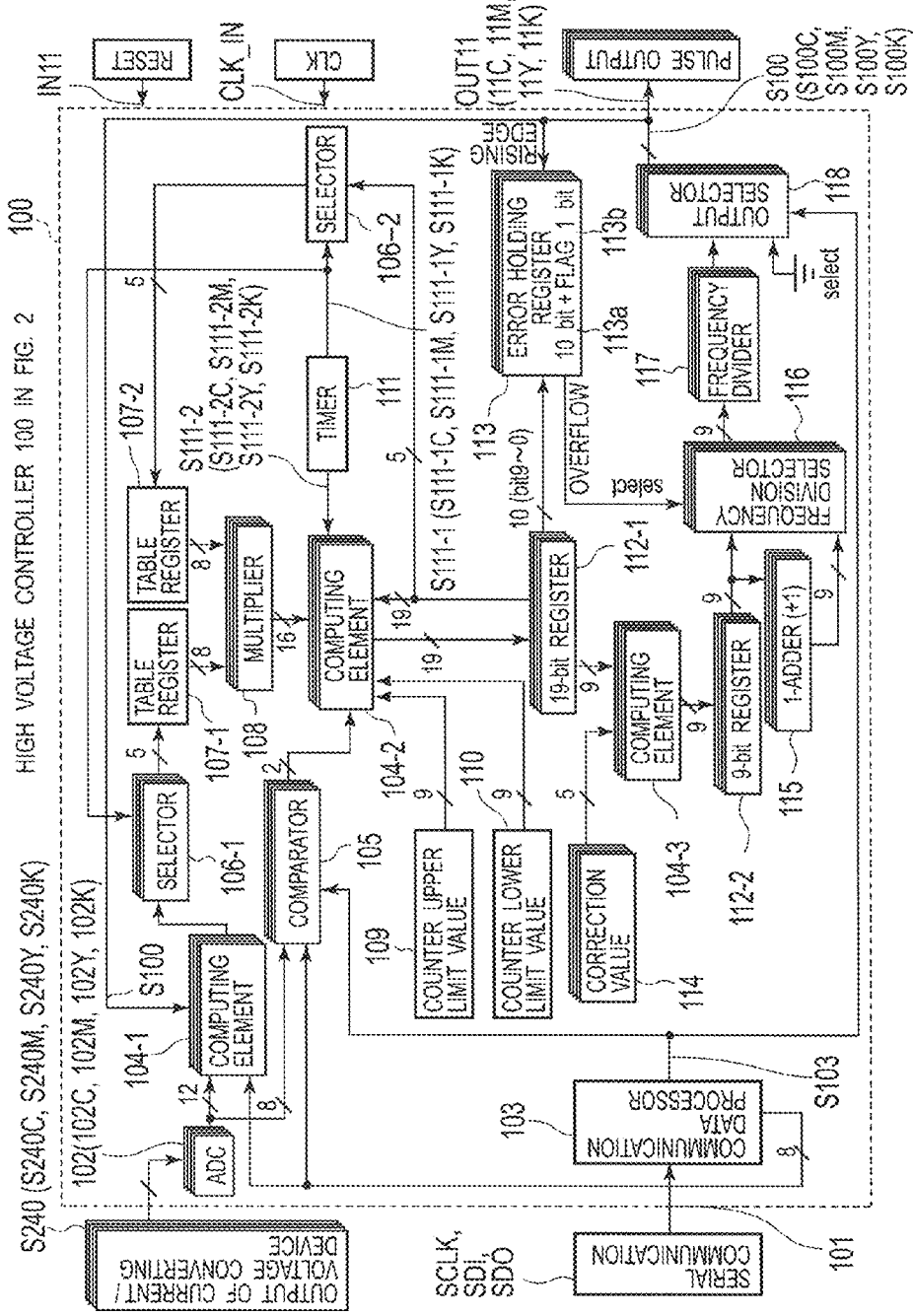
FIG. 6 is a configuration diagram showing high voltage controller 100 in FIG. 2.

FIG. 6 is a configuration diagram showing high voltage controller 100 in FIG. 2.

High voltage controller 100 comprises an ASIC, described by a hardware description language or the like, and is configured as an ASIC, for example, and of clock CLK and reset signal RESET input into high voltage controller 100. Clock CLK is supplied to each of later-described circuit blocks that form a synchronous circuit, and reset signal RESET is supplied to each circuit block for initialization.

High voltage controller 100 includes: ADCs 102 of the four channels of cyan (C), magenta (M), yellow (Y), and black (K) (=102C, 102M, 102Y, 102K) configured to convert analog output voltages S240 for the four channels (=S240C, S240M, S240Y, S240K) into digital signals, respectively; and 8-bit communication data processor 103 configured to receive serial communication signals (SCLK, SDI, and SDO) input from serial communication device 101. Computing elements 104-1 as comparison devices and comparators 105 as comparison devices are both connected to the output side of ADCs 102 and to the output side of communication data processor 103. Selector 106-1 is connected to the output side of computing elements 104-1, and table register 107-1 as a second gain switching device is connected to the output side of this selector 106-1.

Another selector 106-2 is provided corresponding to selector 106-1. Table register 107-2 as a first gain switching device is connected to the output side of this selector 106-2, and 16-bit multipliers 108 as multiplication devices are connected to the output side of these table registers 107-1 and 107-2. Timer 111 is connected to the input side of selectors 106-1 and 106-2, and computing elements 104-2 are connected to the output side of timer 111, comparators 105, and multipliers 108. Controllers that control first division ratios are formed of these selectors 106-1 and 106-2, table registers 107-1 and 107-2, multipliers 108, computing elements 104-2, and timer 111.

While 9-bit counter upper limit value register 109 and 9-bit counter lower limit value register 110 are connected to the input side of computing elements 104-2, 19-bit registers 112-1 as first division ratio holding devices configured to hold the first division ratios are also connected to the I/O sides of these computing elements 104-2. Selector 106-2, error holding registers 113, and computing elements 104-3 as first computing devices are connected to the output side of 19-bit registers 112-1. Correction value registers 114 configured to store respective first correction values are also connected to the input side of computing elements 104-3.

While 9-bit registers 112-2 as second division ratio holding devices configured to hold second division ratios are connected to the output side of computing elements 104-3, 1-adders 115 and frequency division selectors 116 are connected to the output side of 9-bit registers 112-2. The output side of 1-adders 115 is connected to frequency division selectors 116. Frequency dividers 117 as frequency division devices are connected to the output side of frequency division selectors 116. Output selectors 118 configured to output driving pulses S100 (=S100C, S100M, S100Y, S100K) are connected to the output side of these frequency dividers 117. Computing elements 104-1, error holding registers 113, and output ports OUT11 (=11C, 11M, 11Y, 11K) are connected to the output side of output selectors 118.

Hereinafter, the function of each circuit in this high voltage controller 100 is described by referring to FIGS. 7-1, 7-2, and 8.

FIG. 7-1 is a table showing I/O values of table register 107-1 in FIG. 6, and FIG. 7-2 is a table showing I/O values of table register 107-2 in FIG. 6. Moreover, FIG. 8 is a timing chart showing output pulses S111-1 (=S111-1C, S111-1M, S111-1Y, S111-1K) and S111-2 (=S111-2C, S111-2M, S111-2Y, S111-2K) of timer 111 in FIG. 6.

Communication data processor 103 connected to serial communication device 101 outputs an 8-bit value according to a target current output value to comparators 105 in response to the serial communication signals (SCLK, SDI, SDO) received from serial communication device 61 of printer engine controller 60, and switches H/L of ON/OFF signals S103 given to comparators 105 and output selectors 118. Serial communication is transmitted in a combination of a command value and a data value by an interface of a known three-line system. The data is transmitted in combination with 8-bit target current value setting data to a target current value setting command. ON command and off command values are transmitted for ON/OFF of the high voltage output. Dummy data (for example, hexadecimal 00hex, or the like) is transmitted as a pair.

For the four channels C, M, Y, and K, comparators 105 compare the higher 8 bits of ADCs 102 with 8-bit data which is a target current equivalent value output from communication data processor 103, and output comparison results to computing elements 104-2. Each comparison result is 2 bits, and is as follows.
(When ON/OFF signal S103 is "H")
Output value of communication data processor 103>higher 8-bit output value of ADC 102: 01b
Output value of communication data processor 103=higher 8-bit output value of ADC 102: 10b
Output value of communication data processor 103<higher 8-bit output value of ADC 102: 00b
(When ON/OFF signal S103 is "L"): always 00b Multipliers 108 are configured to multiply the 8-bit output value in FIG. 7-1 from table register 107-1 by the 8-bit output value in FIG. 7-2 from table register 107-2, and output a 16-bit value of the multiplication result to computing elements 104-2.

ADCs 102 convert output voltages S240 from current/voltage converting device 242 into 12-bit digital data for each predetermined CLK cycle, and output the 12-bit digital data to computing elements 104-1. Simultaneously, ADCs 102 output only the higher 8 bits of the 12 bits to comparators 105. In the ADC conversion, conversion is performed sequentially for the four channels, and the last converted value is held until the following cycle.

Computing elements 104-1 are configured to divide the 12-bit data output from ADC 102 by 8-bit data output from communication data processor 103, and output an integral value of this divided result to selector 106-1 in 5 bits. Division by computing element 104-1 is conducted using the rise of driving pulses S100 output from output selector 118 as a trigger, and updates the value for each pulse cycle of driving pulse S100, and the 5-bit value is held during time other than update.

In response to output pulses S111-1 (=S111-1C, S111-1M, S111-1Y, S111-1K) shown in FIG. 8 output from timer 111, selector 106-1 switches four of a cyan channel output signal, a magenta channel output signal, a yellow channel output signal, and a black channel output signal of computing elements 104-1, and outputs the output signals to table register 107-1. As shown in FIG. 8, when "H" of output pulse S111-1 (=S111-1C, S111-1M, S111-1Y, S111-1K) is output, selector 106-1 selects the channel output signal of the corresponding color, and always selects one of the four channels.

The higher 5 bits of the 19-bit output signal output from 19-bit register 112-1 are input into selector 106-2 for the four channels. Based on the output pulses S111-1 (=S111-1C, S111-1M, S111-1Y, S111-1K) shown in FIG. 8 and output from timer 111, selector 106-2 outputs 5 bits of one channel among the input 19-bit output signals of the four channels to table register 107-2.

As shown in FIG. 7-1, combinations of 5-bit addresses and 8-bit data are stored in advance in table register 107-1. When the 5-bit data output from selector 106-1 is input, the 8-bit data corresponding to this data is output to multipliers 108. Similarly, as shown in FIG. 7-2, combinations of 5-bit addresses and 8-bit data are stored in advance in table register 107-2. When the 5-bit data output from selector 106-2 is input, the 8-bit data corresponding to this data is output to multipliers 108.

As shown in FIG. 8, timer 111 is configured to output output pulses S111-2 (=S111-2C, S111-2M, S111-2Y, S111-2K) for performing computation in computing elements 104-2, and also pulses S111-1 (=S111-1C, S111-1M, S111-1Y, S111-1K) for selecting a channel by selectors 106-1 and 106-2, at a cycle of equal intervals. The cycle of each of output pulses S111-1 (=S111-1C, S111-1M, S111-1Y, S111-1K) and S111-2 (=S111-2C, S111-2M, S111-2Y, S111-2K) is set arbitrarily. In the first embodiment, the cycle is 140 μsec. This cycle value is desirably approximately 100 to 200 μsec. However, because optimum values of other parameters are also different in the cycle, it is necessary to properly set the cycle.

Computing elements 104-2 are configured to perform computation at each rising edge of the output pulses S111-2 output from timer 111. The computation is conducted through subtraction or addition of 16-bit output values in multipliers 108 and values of the 19 bits in 19-bit registers 112-1 in accordance with the comparison result in comparators 105.

In each of 19-bit registers 112-1, the higher 9 bits designate an integral value of a frequency division ratio, and the lower 10 bits designate a fractional part of the frequency division ratio. The fractional part is a value of (10-bit value)/1024. Computing element 104-2 compares the 9-bit counter lower limit value given from counter lower limit value register 110 with a value of the higher 9 bits of 19-bit register 112-1 at the time of computation updating. In the case of (counter lower limit value)<(higher 9 bits of 19-bit register), computing element 104-2 sets a value of counter lower limit value register 110 to the higher 9 bits of 19-bit register 112-1 and 000hex to the lower 10 bits thereof. Further, computing element 104-2 compares the 9-bit counter upper limit value from counter upper limit value register 109 with a value of the higher 9 bits of 19-bit register 112-1 at the time of computation updating. In the case of (counter upper limit value)<(higher 9 bits of 19-bit register), computing element 104-2 sets a value of counter upper limit value register 109 to the higher 9 bits of 19-bit register 112-1 and 3FFhex to the lower 10 bits thereof.

Error holding registers 113 each comprise 10-bit register 113a and 1-bit overflow flag 113b. When reset signal RESET is input and when ON/OFF signal S103 output from communication data processor 103 is "L," all of register values of 10 bits and a flag value of 1 bit are initialized to be 0. At the rising edge input of driving pulses S100 output from output selectors 118, error holding registers 113 each add a value of lower 10 bits output from 19-bit register 112-1 and a value of 10-bit register 113a in error holding register 113, and holds this added result as a 10-bit register value. Further, error holding register 113 sets 1 to overflow flag 113a in the case where carrying-over occurs at the time of the addition, and clears overflow flag 113b to 0 in the case where no carrying-over occurs. In this error holding register 113, "H" is output to frequency division selector 116 as selection signal select in the case where the value of overflow flag 113b is 1, and "L" is output to frequency division selector 116 as selection signal select in the case where overflow flag 113b is 0.

Correction value register 114 each comprise a 5-bit nonvolatile memory and the like, and store a correction value for the integral value of the higher 9 bits of 19-bit register 112-1. In these correction value registers 114, the correction values of the respective four colors are held as signed 5-bit values of −16 to +15, and are given to computing elements 104-3.

Computing elements 104-3 are configured to receive the higher 9 bits of 19-bit registers 112-1 and the 5 bits of correction value registers 114, add both received values, and output 9-bit values representing corrected integral values of the frequency division ratios as added results to 9-bit registers 112-2. Moreover, 9-bit registers 112-2 hold the 9-bit values representing the corrected integral values of the frequency division ratios, and output the 9-bit values to 1-adders 115 and frequency division selectors 116. 1-adders 115 are configured to receive the 9-bit values representing the integral values of the frequency division ratios output from 9-bit registers 112-2, and output 9-bit values obtained by adding 1 to the respective 9-bit values to frequency division selectors 116.

Frequency division selectors 116 are configured to: receive the values of the 9 bits of 9-bit registers 112-2 and the added values of the 9 bits of 1-adders 115; select one of both received values based on selection signals; select which are the overflow signals output from error holding registers 113 (namely, select the added value of the 9 bits of 1-adder 115 when selection signal select is "H," and select the value of the 9 bits of 9-bit register 112-2 when selection signal select is "L"); and output the selected values to frequency dividers 117.

Frequency dividers 117 each include a 9-bit counter that counts up at the rise of clock CLK. Frequency dividers 117 are configured to compare the 9-bit output values from frequency division selectors 116 with approximately 30% of the respective 9-bit output values. To be precise, the 9-bit output values are each compared with the sum of a ¼ value of the 9-bit output value, a ¹⁄₃₂ value thereof, and a ¹⁄₆₄ value thereof, namely, the sum of a value obtained by right shifting the 9-bit output value of frequency division selector 116 by 2 bits, a value obtained by right shifting the 9-bit output value thereof by 5 bits, and a value obtained by right shifting the 9-bit output value thereof by 6 bits. When the 9-bit output value is equal to the 30% value of the output value of frequency division selector 116, this frequency divider output value is set to "L." When the 9-bit output value is equal to the output value of frequency division selector 116, this frequency divider output value is set to "H," and simultaneously, the inner counter is cleared to 0. By the above-mentioned operation, frequency divider 117 outputs a pulse of approximately 30% of the frequency obtained by dividing clock signal CLK by the output value of frequency division selector 116, to the corresponding one of output selectors 118.

In the first embodiment, clock CLK of 50 MHz is divided into approximately 108 to 130 kHz, which is a piezoelectric transformer drive frequency. For this reason, the frequency division ratio is approximately from 384 (180hex) to 463 (1CFhex); to be precise, the duty is 29.3 to 30.0%. Duty variation in this range hardly influences output voltage variation in the circuit of the first embodiment.

Moreover, in the first embodiment, the sum of the shift values is used as an example in which computation can be performed by one cycle. However, because the divided pulse frequency is at the level of 100 kHz, which is sufficiently low compared to the operating frequency of 50 MHz, it is also possible to use computation which leads accurately to 30%.

Output selectors 118 each select the output pulse of corresponding one of frequency dividers 117 when selection signal select as ON/OFF signal S103 output from communication data processing part 103 is "H," and output the output pulse to corresponding one of output ports OUT11 (=OUT11C, OUT11M, OUT11Y, OUT11K) as driving pulse S100 (=S100C, S100M, S100Y, S100K). Because output selectors 118 each select "L" when selection signal select is "L", output selectors 118 do not output driving pulses S100. Specifically, frequency divider 117 always outputs a pulse to output selector 118 on the basis of the frequency division ratio of the inner counter initial value after reset by reset signal RESET. On the other hand, output selector 118 does not output driving pulse S100 while selection signal select as ON/OFF signal S103 given from communication data processing part 103 is "L" (=OFF).

(Operation of Entire Image Forming Apparatus)

In FIGS. 3 and 4, when print data described by a page description language (PDL) or the like is input to image forming apparatus 1 through host interface part 51 from an unillustrated external apparatus, the print data is converted into bit map data (image data) by command/image processor 52, and sent to LED head interface part 53 and printer engine controller 60. According to a detection value of thermistor 78, heater 77 in fixing unit 18 is controlled by printer engine controller 60 to increase the temperature of heat fusing roller in fixing unit 18 to a predetermined temperature, and the print operation is started.

Sheet 15 set in sheet cassette 13 is fed by feeding roller 14. At a time synchronized with image formation operation described later, sheet 15 is conveyed onto transfer belt 8 by registration rollers 16 and 17. In developing unit 2 of each color (~2K, 2Y, 2M, 2C), a toner image is formed on photoreceptor drum 32 (=32K, 32Y, 32M, 32C) with an electrophotographic process. At this time, each LED head 3 (=3K, 3M, 3Y, 3C) is turned on according to the bit map data. The toner image developed by developing unit 2 of each color is transferred onto sheet 15 conveyed on transfer belt 8, by a DC bias of a high voltage applied from power unit 80 to the corresponding one of transfer rollers 5 (=5K, 5Y, 5M, 5C). After the toner images of the four colors are transferred onto sheet 15, the toner images are fixed by fixing unit 18, and sheet 15 is discharged.

(Operation of Power Unit)

First, schematic operation of power unit 80 in FIG. 1 is described.

Power unit 80 in FIG. 1 is a power unit for transfer high voltage of four outputs, for example. In color image forming apparatus 1, transfer is performed using four-channel output of cyan (C), magenta (M), yellow (Y), and black (K), and the four channels have the same configuration. Accordingly, only one channel is described.

Printer engine controller 60 transmits predetermined command data to serial communication device 101 of high voltage controller 100 by serial communication device 61. The command data includes a command that specifies a high voltage output channel and 8-bit data corresponding to a high voltage target current value. The command data is transmitted prior to a high voltage output. The data value corresponds to the detection value of ADC 102 in high voltage controller 100. Output port OUT11 in high voltage controller 100 holds the "L" level.

Upon receipt of a command from serial communication device 61 to give an instruction to turn on the high voltage output, high voltage controller 100 outputs driving pulse S100 obtained by dividing the clock CLK output from oscillator 90 from output port OUT11, and sends driving pulse S100 to piezoelectric transformer drive circuit 210. High voltage controller 100 changes the frequency division ratio according to the detection value of ADC 102. Details are described later.

By driving pulse S100 from high voltage controller 100, piezoelectric transformer drive circuit 210 switches the voltage of DC 24 V supplied from DC power supply 95, and drives the primary side of piezoelectric transformer 220 to output a high AC voltage from the secondary side of piezoelectric transformer 220. The high AC voltage is rectified by rectifying circuit 230, converted into a DC high voltage, and supplied to output load ZL.

At this time, output current supplying device 241 in output voltage supplying device 240 supplies a current to rectifying circuit 230. This current is converted into a voltage by current/voltage converting device 310 in output voltage supplying device 240, and this output voltage S240 is input into ADC 102 in high voltage controller 100 to be converted into digital data. High voltage controller 100 compares the digital data converted by ADC 102 with digital data equivalent to the target current equivalent voltage value instructed by printer engine controller 60, and controls the output frequency of driving pulse S100 output from output port OUT11 so that both may be equal.

Next, detailed operation of power unit 80 in FIG. 2 is described.

Printer engine controller 60 sets reset signal RESET output from output port OUT1 to "L," and resets various settings in high voltage controller 100. By this reset operation, the frequency division ratio of driving pulse S100 output from output port OUT11 and the like are set to initial values. High voltage controller 100 divides clock CLK of oscillator 90 input through clock input port CLK_IN, on the basis of the frequency division ratio of the initial value and at on-duty of 30%. Note that until high voltage controller 100 receives the command to turn on the high voltage from printer engine controller 60, high voltage controller 100 does not output divided driving pulse S100 from output port OUT11, and holds output port OUT11 at the "L" level.

By serial communication device 61, printer engine controller 60 outputs serial clock SCLK as a synchronizing clock, and outputs serial data input signal SDI in synchronization with this serial clock SCLK to thereby transmit an arbitrary command for setting the high voltage output target current and the 8-bit data as the target ADC detection value to high voltage controller 100. For example, in the case of 10 µA, the detection voltage is 0.33 V, which results in 3.3 V 8 bit. Thus, the transmit data is 1AH.

Oscillator 90 is connected to clock input port CLK_IN of high voltage controller 100 through resistance 92. In oscillator 90, DC 3.3 V of power supply 91 is supplied to power supply terminal VDD and output enable terminal OE. Immediately after powering on, clock CLK at 50 MHz and the cycle of 20 nsec is output from output clock terminal CLK_OUT, and is supplied to clock input port CLK_IN of high voltage controller 100.

While output port OUT11 of high voltage controller 100 is held at "L," NMOS 211 in piezoelectric transformer drive circuit 210 is turned off. Accordingly, DC 24 V supplied from DC power supply 95 is applied to primary side input terminal 221 of piezoelectric transformer 220 as it is. In this state, the current value of DC 24 V is approximately 0, and piezoelectric transformer 220 does not oscillate. Accordingly, the output voltage of secondary side output terminal 222 of piezoelectric transformer 220 is 0 V, and the output current is 0 A. For that reason, analog output voltage S240 of op-amp 244 that forms output voltage supplying device 240 is at a VOL level. A result obtained by ADC 102 in high voltage controller 100 through conversion of analog output voltage S240 into digital value is also 000hex (12 bits).

Printer engine controller 60 transmits the command to give an instruction to turn on the high voltage to high voltage controller 100 by serial communication device 61 at a predetermined time (specifically, a time at which sheet detection sensor 40 detects sheet 15, and subsequently sheet 15 reaches the nip portion between transfer roller 5K and photoreceptor drum 32K). Immediately after high voltage controller 100 receives the command by serial communication device 101 and processes the received data, high voltage controller 100 outputs driving pulse S100 divided by the initial value from output port OUT11. In the first embodiment, the initial value is driving pulse S100 divided by 384 at one cycle of 7.68 sec and the on-duty of 29%.

NMOS 211 in piezoelectric transformer drive circuit 210 is switched by driving pulse S100 output from output port OUT11. By inductor 213, capacitor 214, and piezoelectric transformer 220, a half wave sine wave of several tens volts is applied to primary side input terminal 221 of this piezoelectric transformer 220. Thereby, piezoelectric transformer 220 oscillates so that a boosted AC voltage is generated in secondary side output terminal 222. Note that at a drive frequency of 130 kHz divided by 384, the output voltage is approximately AC 100 V and the output current is very small. Accordingly, there is substantially no current flowing through resistance 246 in output voltage supplying device 240, and output voltage S240 of op-amp 244 input into ADC 102 remains in the vicinity of 0 V.

As described later in detail, high voltage controller 100 samples output voltage S240 input into ADC 102 for each predetermined period. The predetermined period suffices as long as all of the four channels can be detected within one period (time shorter than 140 μsec in the first embodiment), and is 128 cycles and 2.56 sec in the first embodiment. In ADC 102, analog-digital conversion is conducted at a cycle of 2.56 μsec, and the C, M, Y, and K channels are converted sequentially. Accordingly, detection conversion of the four channels is conducted at a cycle of 10.24 μsec. A detection result is held in 12 bits. High voltage controller 100 compares the higher 8 bits of the held 12-bit value with the 8-bit set value input as the transmitted data. High voltage controller 100 performs control to reduce the drive frequency of driving pulse S100 in the case where set value>detection value, and to raise the drive frequency in the case of set value<detection value. In the case of set value=detection value, the drive frequency is kept constant.

The minimum resolution is 0.33 Hz because the frequency control value has a 9-bit integer part and a 10-bit fraction part. An ADC input value as a feedback voltage (S240) is smoothed by capacitor 243 mounted to output voltage supplying device 240. For that reason, in the state of set value=detection value, the drive frequency is stabilized, and constant current control is performed. At this time, output voltage S240 of op-amp 244 is 0.336 V.

(Operation of High Voltage Controller in Power Unit)

Operation of high voltage controller 100 in FIG. 6 in power unit 80 is described.

When reset signal RESET is input into input port IN11 of high voltage controller 100 from printer engine controller 60, each counter value and the like is initialized. Computing element 104-2 sets a 19-bit value, in which the 9-bit value of counter lower limit value register 110 is set to the higher 9 bits thereof whereas the lower 10-bit value is set to 0, to 19-bit register A112-1. The 19-bit value of the initial value is 60000hex.

Correction value registers 114 each hold signed 5-bit data. For example, C holds 00hex, M holds 08hex, Y holds 18hex, and K holds 01hex. Computing elements 104-3 add the values of 19-bit registers 112-1 to the values of correction value registers 114, and output the added results to 9-bit registers 112-2. Then, 9-bit registers 112-2 hold the added results. For example, among 9-bit registers 112-2, C holds 180hex, M holds 188hex, Y holds 178hex, and K holds 181hex.

The values of 9-bit registers 112-2 are incremented by 1-adders 115. The incremented values and the values of 9-bit registers 112-2 are inputted into frequency division selectors 116. These input values are 180/181hex for C, 188/189hex for M, 178/179hex for Y, and 181/182hex for K. After reset signal RESET of the initial state is input, the 9-bit value of 9-bit register 112-2 (for example, 180hex in the case of C) is input into frequency divider 117 through frequency division selector 116. Whenever frequency divider 117 counts clock CLK from 0 to 180hex, frequency divider 117 outputs a pulse. Thereby, a pulse divided by 384 and having duty of 30% is output from frequency divider 117.

Output selector 118 outputs driving pulse S100 in the case where ON/OFF signal S103 output from communication data processing part 103 is ON (="H"), and holds the output "L" in the case where ON/OFF signal S103 is not ON.

The lower 10 bits of 19-bit register 112-1 is a counter indicating the frequency division ratio at the decimal level. The frequency division ratio starts from a 180hex (384) frequency. An error of the value indicating the decimal point is added by error holding register 113 until the frequency division ratio becomes a 181hex (385) frequency. When a result of the added error is not less than one, 1 is added to the frequency division ratio of the pulse.

For example, in the case where the value of 19-bit register 112-1 is 60200hex, the 9 bit-value as the integer part is 180hex, and 10-bit value as the fraction part is 200hex. In the case where the value of error holding register 113 is 000hex (10 bits) and the overflow flag is 0 in this state, the higher 9 bits of 19-bit register 112-1 are corrected with the value of correction value register 114, and the output value of 9-bit register 112-2 is selected by frequency division selector 116 through computing element 104-3 and input into frequency divider 117. This input value is divided by frequency divider 117, and driving pulse S100 divided by 180hex (384) and having 130.208 kHz is output through output selector 118.

Output driving pulse S100 is output from output port OUT11, and is applied to piezoelectric transformer drive circuit 210. Simultaneously, output driving pulse 8100 is also input into error holding register 113 in high voltage controller 100. Error holding register 113 adds the 000hex (10 bits) value and 200hex of the lower 10 bits of 19-bit register 112-1, holds the added result 200hex, and sets overflow flag 113b to "L." Thereafter, similarly, when the driving pulse is output next, the fraction part of 200hex and the error holding register value of 200hex are added to be 400hex, and the holding range of the 10-bit register value is from 000 to 3FF. Accordingly, the value of error holding register 113 is set to 000hex, and overflow flag 113b is set to "H." A frequency indicating value of the pulse output from 19-bit register 112-1 is 180hex (384) in the integer part, 200hex (512) in the fraction part, and 384.5 as a real value. As mentioned above, in this case, the pulse divided by 384 and the pulse divided by 385 are alternately output, and an average of the frequency division ratio is 384.5.

Moreover, in the case where the fraction part is 180hex, the value of error holding register 113 changes from 000hex, 180hex, 300hex, to 080hex. When the value of error holding register 113 changes from 300hex to 080hex, overflow flag 113b becomes "H." In the case where the integer part is N, the frequency division ratio change like "divided by N," "divided by N," "divided by N," and "divided by N+1," and finally the frequency division ratio average becomes N+(384/1024).

The frequency division ratio indicating value of 19-bit register 112-1 is updated by computing element 104-2. This update process is described below.

While communication data processor 103 holds high voltage ON/OFF signal S103 at "L," output selector 118 outputs "L" so that piezoelectric transformer drive circuit 210 is turned off.

Image forming apparatus 1 starts the print operation. In order to output the transfer bias, by a predetermined command, an 8-bit value equivalent to the transfer target current is first transmitted to high voltage controller 100 as serial communication signals (SCLK, SDI, and SDO) from printer engine controller 60. Communication data processor 103 in high voltage controller 100 outputs the 8-bit data when receiving the command data. For example, suppose that each circuit constant is set so that an ADC channel range may be 0 to 3.3 V and the output current range may be 0 to 100 μA. Resistance 246 in FIG. 2 is 33 kΩ in this case. In the case where the transfer target current value is 10 μA, the 8-bit set value is 1Ahex.

At this point, a high voltage is not output yet, and output voltage S240 of op-amp 244 in FIG. 2 is approximately 0 V. Moreover, a 12-bit input value of ADC 102 is 000hex for all of the four channels.

Moreover, 19-bit register 112-1 in high voltage controller 100 is set at an initial value of 60000hex. Specifically, the higher 9-bit integer part is set at 180hex, and the lower 10-bit fraction part is set at 000hex. "L" of ON/OFF signal S103 output from communication data processor 103 is input into comparator 105. Comparator 105 outputs 00b to computing element 104-2.

ADCs 102 of the four channels C, M, Y, and K convert analog output voltages S240 from current/voltage converting devices 242 into 12-bit digital data, and send the 12-bit digital data to computing elements 104-1 and comparators 105. For example, each ADC 102 converts the voltage value of output voltage S240 into a digital value at each cycle of 2.56 μsec. In analog/digital conversion, the four channels of C, M, Y, and K are converted sequentially, and the conversion of the four channels is repeated at a cycle of 10.24 μsec. The output 12-bit data is updated at each conversion cycle, and the value is held until the data is updated. In the state where the high voltage is not outputted, 000hex is output.

Computing element 104-1 performs data processing on the 12-bit output of ADC 102 and the 8-bit output of communication data processor 103, and outputs 5-bit data to selector 106-1.

Figure 9:
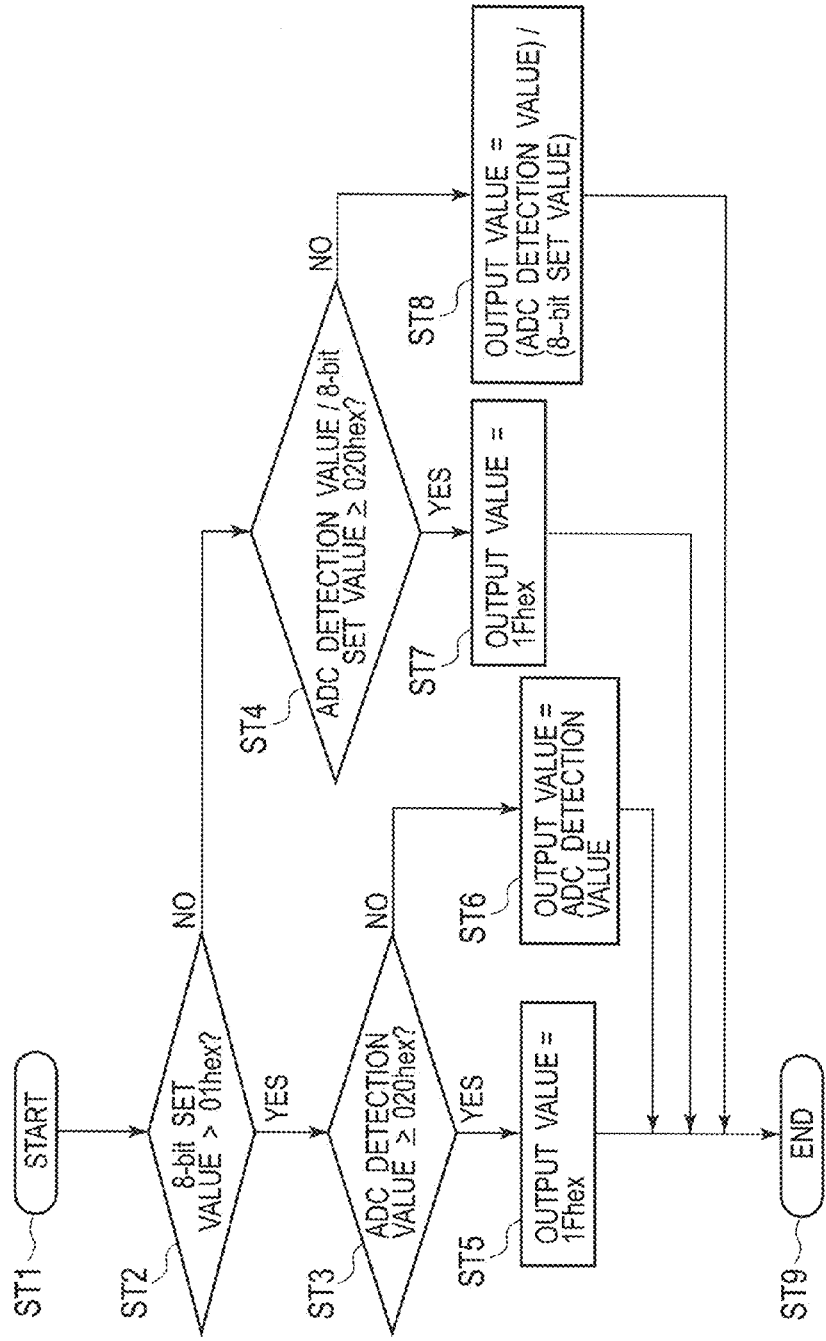
FIG. 9 is a flow chart showing data processing in computing element 104-1 in FIG. 6.

FIG. 9 is a flow chart showing the data processing in computing element 104-1 in FIG. 6.

Computing element 104-1 starts the data processing at step ST1. At step ST2, it is determined whether the 8-bit set value is larger than 01hex. When the 8-bit set value is larger than 01hex (Y), the processing proceeds to step ST3; otherwise (N), the processing proceeds to step ST4.

At step ST3, it is determined whether the detection value of ADC 102 is not less than 020hex. When the detection value of ADC 102 is not less than 020hex (Y), the processing proceeds to step ST5; otherwise (N), the processing proceeds to step ST6.

At step ST4, it is determined whether the integral value obtained by dividing 12 bits of the ADC detection value by the 8-bit set value (the remainder is truncated) is not less than 020hex. When the integral value is not less than 020hex (Y), the processing proceeds to step ST7; otherwise (N), the processing proceeds to step ST8. At step ST5, 5 bits of the output value of computing element 104-1 is output as 1Fhex. At step ST6, the 5 bits of the output value of computing element 104-1 is set as the lower 5 bits of the 12-bit ADC detection value input. At step ST7, 5 bits of the output value of computing element 104-1 is output as 1Fhex.

Moreover, at step ST8, the 5 bits of the output value of computing element 104-1 is set as (12-bit ADC detection value)/(8-bit set value), and the data processing is performed at step S9.

Because the detection value of ADC 102 is 000hex in high voltage controller 100 in FIG. 6, the output value of computing element 104-1 is 00hex (5 bits). The detecting cycle of ADC 102 and the computation cycle of computing element 104-1 do not need to synchronize with each other, and may have a time shorter than the cycle of 1-bit output pulses S111-1 and S111-2 output from timer 111 described later.

Although the data processing of computing element 104-1 is described using the flow chart in FIG. 9, the data processing of computing element 104-1 is formed of a known dividing circuit processed at predetermined cycle CLK.

At the timing shown in FIG. 8, selector 106-1 selects one of the output values of computing elements 104-1 of the four C, M, Y, and K, and outputs the selected value to table register 107-1. While 5-bit data is input into table register 107-1, table register 107-1 outputs 8-bit data to multiplier 108. In this case, table register 107-1 outputs C0hex (8 bits), because the input value is 00hex (5 bits) as shown in FIG. 7-1.

A total of 20 bits made of higher 5 bits of 19-bit registers 112-1 for the four channels C, M, Y, and K is input into selector 106-2. Selector 106-2 selects 5 bits of one color among the bits, and outputs the 5 bits to table register 107-2.

While the 5-bit data is input into table register 107-2, table register 107-2 outputs 8-bit data to multiplier 108. In this case, because the higher 5 bits of 19-bit register 112-1 are 18hex, table register 107-2 outputs 80hex (8 bits) according to the value input through selector 106-2, as shown in FIG. 7-2.

Multiplier 108 multiplies the 8-bit output of table register 107-1 and the 8-bit output of table register 107-2, and outputs 6000hex to computing element 104-2 as a result of (C0hex)× (80hex)=6000hex 16-bit value.

At the timings shown in FIG. 8, timer 111 outputs pulses S111-1 (=S111-1C, S111-1M, S111-1Y, S111-1K) to selectors 106-1 and 106-2 in such a way that the channels of C, M, Y, and K are selected sequentially at a cycle of 140 μsec. Moreover, timer 111 outputs pulses S111-2 (=S111-2C, S111-2M, S111-2Y, S111-2K) to computing elements 104-2 while output pulse S111-1 is selected by selectors 106-1 and 106-2. Computing element 104-2 performs the following computation by using a rising edge of output pulse S111-2 from timer 111 as a trigger.

Computing element 104-2 of each channel subtracts 6000hex as a 16-bit output of multiplier 108 of the channel from the 19-bit value inputted from 19-bit register 112-1 of the channel because the 2-bit output of comparator 105 of the channel is 00b. By the subtraction, 60000−6000=5A000hex. The result of the computation is compared with the counter lower limit value of counter lower limit value register 110 at the time of the subtraction. The counter lower limit value is 180hex in terms of 9-bit value. When the counter lower limit value is compared with 168hex, i.e., the higher 9 bits of 5A000hex, 180hex>168hex. Then, the higher 9 bits of the result of the computation are 180hex. As a result, in 19-bit register 112-1, the value is updated to 60000hex and substantially the same value is held.

The value of 19-bit register 112-1 is held at 60000hex until ON/OFF signal S103 of the high voltage output becomes "H." Because the higher 9 bits of 19-bit register 112-1 are 180hex and the lower 10 bits thereof are 000hex, a value corrected with the correction value of correction value register 114 (C; 180hex, 188hex, Y; 178hex, K; 181hex) is sent to frequency divider 117.

Frequency dividers 117 output pulses to output selectors 118 on the following conditions: C; 384 CLK cycle and a cycle of 7.68 μsec as time, M; 392 CLK cycle and a cycle of 7.84 μsec as time, Y; 376 CLK cycle and a cycle of 7.52 μsec as time, K; 385 CLK cycle and a cycle of 7.70 μsec as time, during ON ("H") time, (dividing counter value/4+dividing counter value/32+dividing counter value/64), at the on-duty of approximately 30%. Output selector 118 outputs "L" because ON/OFF signal S103 is "L."

As described above, first, the 8-bit set value equivalent to the target current is transmitted to high voltage controller 100 from printer engine controller 60, and driving pulse S100 as the initial value is generated internally.

Next, image forming apparatus 1 starts sheet feeding operation. Printer engine controller 60 transmits a command to turn on the high voltage output with serial communication signals (SCLK, SDI, and SDO), to communication data processor 103 in high voltage controller 100 in a predetermined time elapsed since the sheet end is detected by sheet detection sensor 40. Communication data processor 103 sets ON/OFF signal S103 to "H" immediately after the data receiving processing. This command sequentially turns C, M, Y, and K on in accordance with the transfer nip position.

When ON/OFF signal S103 becomes "H," driving pulse S100 of 130.2 kHz and a duty of 30% is output to output port OUT11 from output selector 118, and the current flows into secondary output terminal 222 of piezoelectric transformer 220 by piezoelectric transformer drive circuit 210. At this point, the current value is also low, and the input value of ADC 102 is also 000hex (12 bits).

The higher 8 bits of the value of ADC 102 are input into comparator 105, and are compared with the output value of communication data processor 103 (namely, the 8-bit value equivalent to the target current value). In the state where ON/OFF signal S103 is "H" (namely, when the output is ON), in the case of (output value of communication data processor 103)>higher 8 bits of output value of ADC 102, 01b is output to computing element 104-2 from comparator 105. Bit1 is 1 in the case where the output value of communication data processor 103 and the higher 8 bits of the output value of ADC 102 are equal; otherwise, bit1 is 0. Moreover, bit0 is 1 in the case where the output value of communication data processor 103 is larger (namely, in the case of less than the target current value), and bit0 is 0 in the case where the output value of communication data processor 103 is larger than the target current value. Comparator 105 outputs 10b in the case where both values are equal as (output value of communication data processor 103)=(higher 8 bits of output value of ADC 102). Comparator 105 outputs 00b in the case where (output value of communication data processor 103)<(higher 8 bits of output value of ADC 102).

Because the output value of communication data processor 103 is 1Ahex and the higher 8 bits of the output value of ADC is 00hex, 01b is output to computing element 104-2 from comparator 105. Because the ADC detection value is 000hex (12 bits), similarly to the above case, table register 107-1 outputs C0hex, and table register 107-2 outputs 80hex. Multiplier 108 outputs 16 bits of a multiplication result of (C0)×(80)=6000hex to computing element 104-2. Because the output value of comparator 105 is 01b, computing element 104-2 adds 6000hex to 60000hex of 19-bit register 112-1, and compares the 19 bits of 66000hex with the 9-bit value of counter upper limit value table 109. The 9-bit value is 1CFhex. Computing element 104-2 compares the higher 9 bits of 66000hex with 198hex. Because the higher 9 bits are not more than the upper limit value of counter upper limit value register 109, 19-bit register 112-1 is updated with the value of 66000hex. Thereafter, using the updated value, the higher 9-bit value is added to the correction value of correction value register 114 by computing element 104-3. The added value is output sequentially to 9-bit register 112-2, 1-adder 115 and frequency division selector 116. Then, frequency divider 117 outputs the pulse at an updated low frequency.

Thereafter, the frequency of driving pulse S100 is reduced according to the same flow. As a result, the high output voltage is increased, and the high output current is also increased following the increase of the output voltage. As the output current increases, the 12-bit detection value of ADC 102 changes, and the output values of computing element 104-1 and table registers 107-1 and 107-2 also change as shown in FIG. 9. The frequency of driving pulse S100 is controlled in a direction to become lower. When the high output current is in the vicinity of 10 µA of the target current value along with the increase of the high output voltage, the output value of table register 107-1 becomes 01hex, the update value of 19-bit register 112-1 is reduced, and the amount of change of the output voltage per unit time is reduced.

At this time, in the update value of 19-bit register 112-1, change of the input value input into frequency division selector 116 decreases by updating the 10 bits of the fraction part, i.e., by adding by 01 to 80hex according to the output value. The value of error holding register 113 changes with the lower 10 bits of the value of 19-bit register 112-1, and the proportion per unit time of frequency division ratio N and frequency division ratio N+1 selected by frequency division selector 116 changes.

When the target current value is reached, the 8-bit setting value becomes equal to the 8 bits of the output value of ADC 102, the value of 19-bit register 112-1 is fixed, and the output current is stabilized at 10 µA.

Immediately before sheet 15 in image forming apparatus 1 passes through the transfer nip (namely, in a predetermined time after the rear end of sheet 15 passes sheet detection sensor 40), printer engine controller 60 transmits the command to give an instruction to turn off the high voltage to high voltage controller 100 by serial communication, and sets ON/OFF signal S103 of communication data processor 103 to "L." The turning off is also sequentially performed from K, Y, M, to C as the turning on is performed sequentially. Moreover, the 8-bit output value of communication data processor 103 is set to 00hex at the same time as when ON/OFF signal 8103 is set to "L." The output value of output selector 118 is set to "L" by "L" of ON/OFF signal S103. As a result, drive of piezoelectric transformer 220 stops and the high voltage output is turned off.

By setting ON/OFF signal S103 of communication data processor 103 to "L," the 2-bit input value to computing element 104-2 is set to 00b, and the 16-bit output of multiplier 108 is subtracted at a cycle of 140 µsec. Moreover, the 8-bit value input into computing element 104-1 is 00hex, and the detection value of ADC 102 does not become 0 immediately after the output is OFF. For this reason, the output value of table register 107-1 is increased. The higher 9 bits of 19-bit register 112-1 is subtracted down to the counter lower limit value of counter lower limit value register 110, and returned to the initial value by computing element 104-2. Then, 19-bit register 112-1 stands by until the high voltage output instruction for the next printing.

Modification of First Embodiment

The first embodiment may be modified as (1) to (4) given below.

(1) In the first embodiment, piezoelectric transformer 220 having a resonance frequency of approximately 108 kHz and a driving frequency range of 108 to 130 kHz is used. However, a piezoelectric transformer having a smaller size and a higher drive frequency than this piezoelectric transformer 220 may be used, or a piezoelectric transformer having a larger size and a lower drive frequency may be used.

(2) In the first embodiment, the frequency of clock CLK is 50 MHz, but the invention can be implemented also at a lower frequency such as 20 MHz.

(3) In the first embodiment, the processing is performed with the 9 bits of 19-bit register 112-1 as an integer part and the 10 bits thereof as a fractional part. However, the optimum value changes depending on the necessary frequency resolution, and thus the number of bits is not limited to the above. For example, in a case of CLK at 25 MHz, the integer part may be 8 bits, and the fraction part may be 11 bits, and so forth.

(4) In the first embodiment, the case of four transfer channels is described. However, it is possible to change the duties of output pulses S111-1 and S111-2 output from timer 111 and to control the developing bias and the charging bias simultaneously.

Advantageous Effect of First Embodiment

According to power unit 80 of the first embodiment and image forming apparatus 1 using it, using the common gain, frequency limit, and the like to control the piezoelectric transformer drive frequency, the frequency is shifted by computing element 104-3 according to the correction value of correction value register 114 immediately before piezoelectric transformer drive is performed. Accordingly, a high voltage output in the vicinity of the resonance frequency of piezoelectric transformer 220 is achieved, without changing either components or logical circuits, and production variation of piezoelectric transformer 220 can be corrected. In addition, stable constant current control is achieved so that stable output is achieved irrespective of the environment, and a stable image without a density level difference or a lateral stripe can be obtained.

Second Embodiment

The configuration according to a second embodiment of the invention is the same as that of image forming apparatus 1 in FIG. 3 and the control circuit in FIG. 4 in the first embodiment, and is different from the configuration of power unit 80 in FIG. 1 in the first embodiment. Hereinafter, the power unit of the second embodiment is described.

(Configuration of Power Unit)

Figure 10:
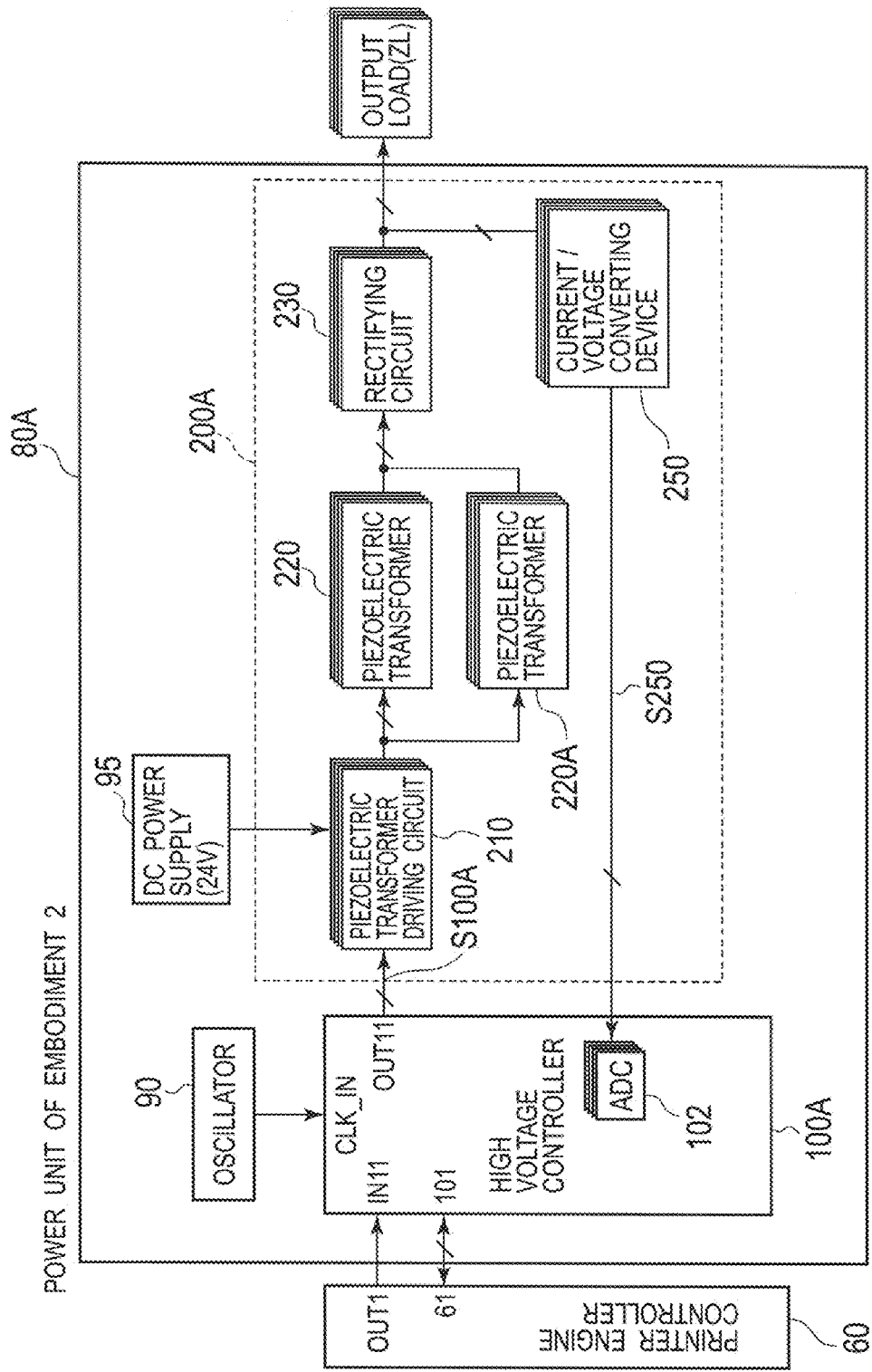
FIG. 10 is a block diagram showing a schematic configuration of a power unit according to a second embodiment of the invention.

FIG. 10 is a block diagram showing a schematic configuration of power unit 80A in the second embodiment of the invention, and common reference numerals are given to components common to those in FIG. 1 showing power unit 80 of the first embodiment.

In the first embodiment, the configuration in the case of using power unit 80 in FIG. 1 for transfer bias is described. In the second embodiment, a configuration in the case of using power unit 80A in FIG. 10 for charging bias is described.

Power unit 80A of the second embodiment includes same oscillator 90 and DC power supply 95 as those of the first embodiment, and high voltage controller 100A and piezoelectric transformer high voltage circuit 200A having different configurations from those of the first embodiment.

While high voltage controller 100 of the first embodiment is configured to perform constant current control, high voltage controller 100A of the second embodiment is configured to perform constant voltage control.

Similarly to the case of high voltage controller 100 of the first embodiment, high voltage controller 100A of the second embodiment is a circuit configured to divide clock CLK supplied from oscillator 90, on the basis of control signals supplied from printer engine controller 60 serving as a target value setting device for setting a target voltage, and output driving pulses S100A to piezoelectric transformer high voltage circuits 200A. High voltage controller 100A includes: clock input port CLK_IN; reset input port IN11 that receives reset signal RESET; serial communication device 101 connected to serial communication device 61 of printer engine controller 60; output ports OUT11 that output driving pulses S100A; ADCs 102 that are converting devices; and the like.

Piezoelectric transformer high voltage circuits 200A include: piezoelectric transformer drive circuits 210 similar to those of the first embodiment and connected to output nodes OUT11 of high voltage controller 100A and the output side of DC power supply 95; piezoelectric transformer 220 of one channel for C transfer substantially the same as that of the first embodiment and connected to the output side of this piezoelectric transformer drive circuits 210; piezoelectric transformers 220A of three channels for M, Y, and K transfer different from those of the first embodiment and connected to the output side of piezoelectric transformer drive circuits 210; rectifying circuits 230 of the four channels that are the same rectifying device as those of the first embodiment and connected to the output side of these piezoelectric transformers 220A; and output voltage converting devices 250 of the four channels different from those of the first embodiment and connected to the output side of these rectifying circuits 230.

Output voltage converting device 250 is a circuit configured to convert a DC high voltage output from rectifying circuit 230 into a low voltage level detectable by ADC 102 in high voltage controller 100A, and ADC 102 is connected to the output side of output voltage converting device 250.

Figure 11:
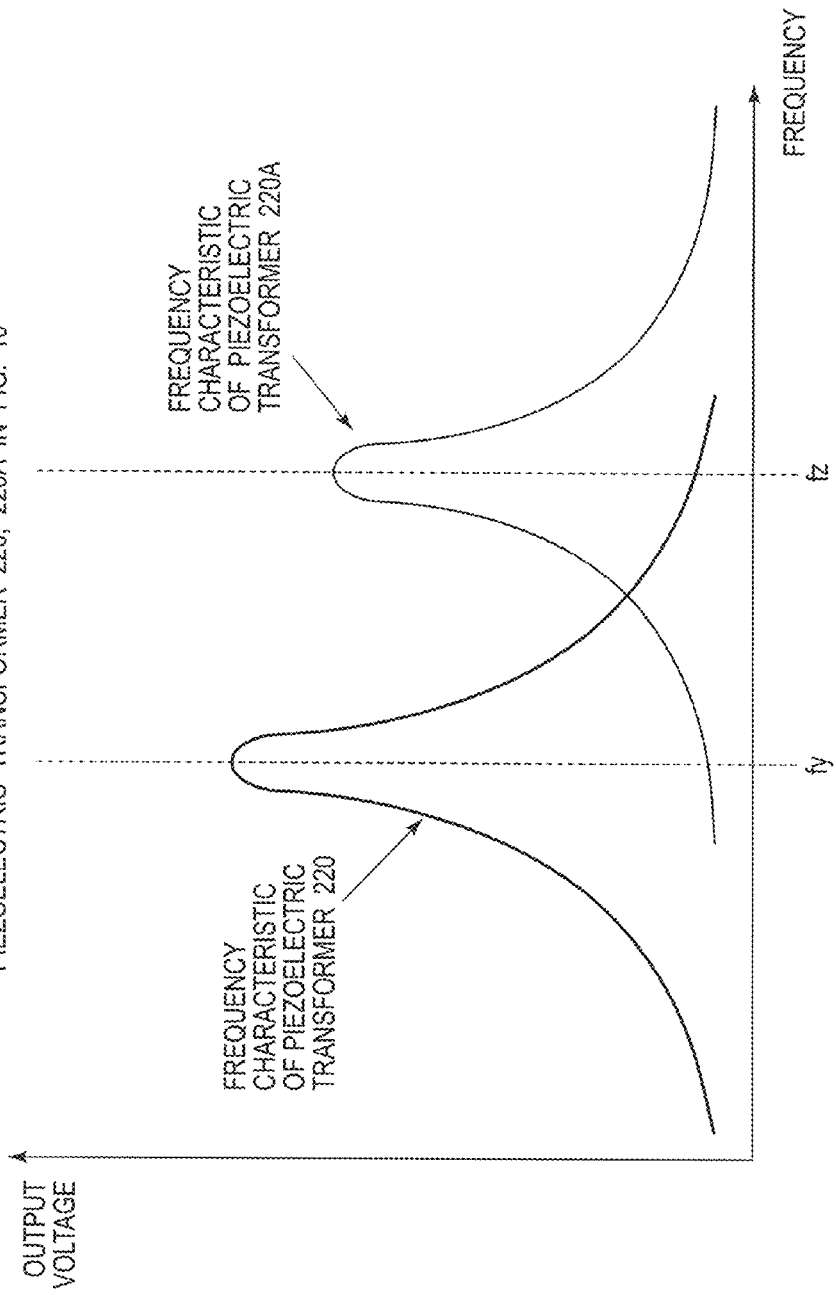
FIG. 11 is an output voltage/frequency characteristic chart of piezoelectric transformers 220 and 220A in FIG. 10.

FIG. 11 is an output voltage/frequency characteristic chart of piezoelectric transformers 220 and 220A in FIG. 10.

Being substantially the same as the first embodiment, piezoelectric transformer 220 of the one channel for C transfer is a piezoelectric transformer having a resonance frequency of 110 kHz and a drive frequency of 110 to 130 kHz. On the other hand, piezoelectric transformers 220A of the three channels for M, Y, and K charging are piezoelectric transformers each having a resonance frequency of 150 kHz and a drive frequency of 150 to 177 kHz. For example, in image forming apparatus 1 of a tandem direct transfer type, it is necessary to make a downstream transfer bias higher by charging sheet 15 as a transfer medium. For that reason, by using a piezoelectric transformer having a large size and a high output voltage for only C, cost can be reduced and the sizes of components on a substrate can be reduced.

Figure 12:
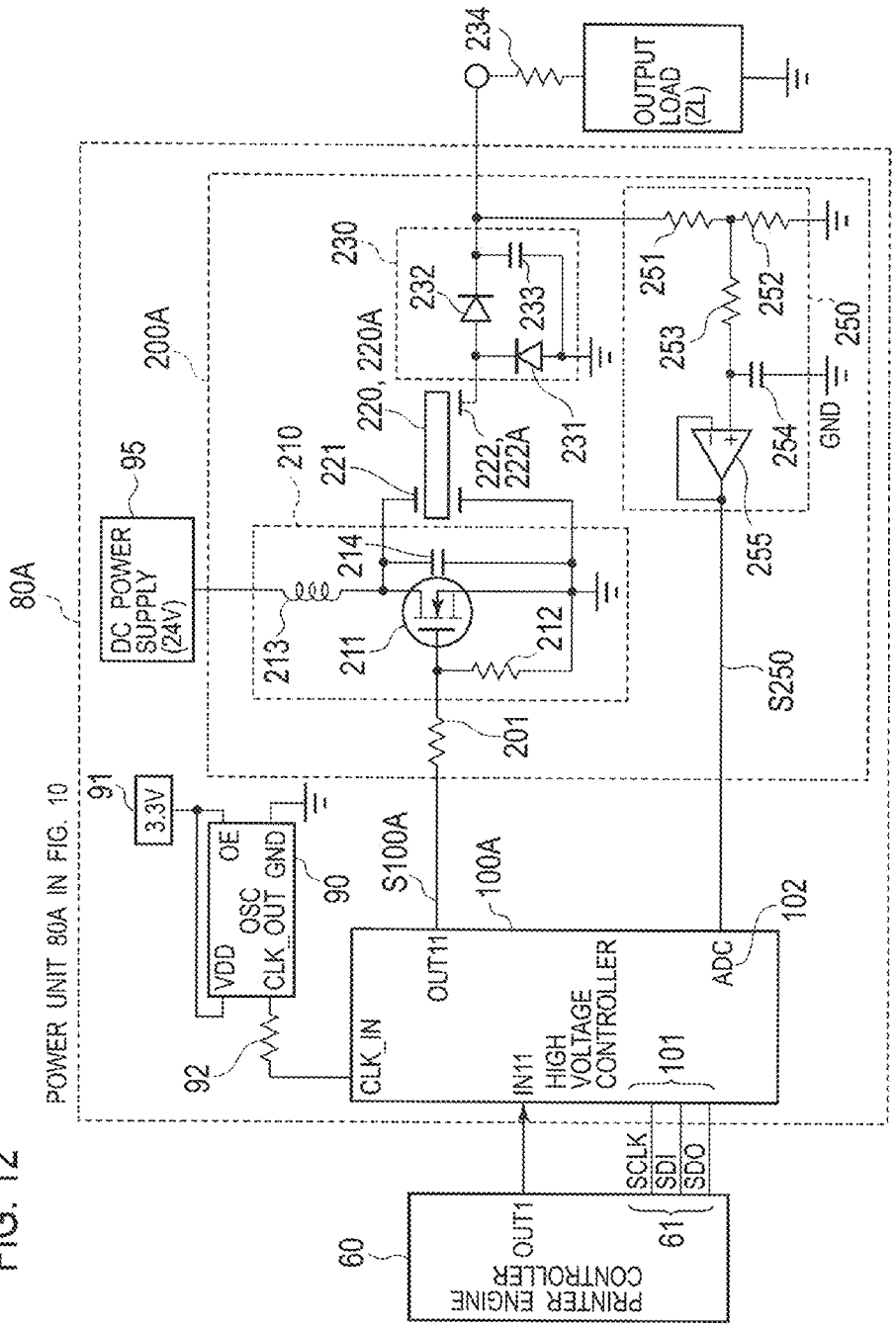
FIG. 12 is a circuit diagram showing an example of a detailed configuration in power unit 80A in FIG. 10.

FIG. 12 is a circuit diagram showing an example of a detailed configuration in power unit 80A in FIG. 10, and common reference numerals are given to components common to those in FIG. 2 showing power unit 80 of the first embodiment.

In FIG. 12, similarly to FIG. 2, for simple description, piezoelectric transformer high voltage circuit 200A of one channel is shown among piezoelectric transformer high voltage circuits 200A of the four channels having the same circuit configuration. In piezoelectric transformers 220 and 220A in piezoelectric transformer high voltage circuit 200A, primary side input terminal 221/221A is connected in parallel to capacitor 214 in piezoelectric transformer drive circuit 210, and secondary side output terminals 222/222A is connected to the cathode of diode 231 and the anode of diode 232 in rectifying circuit 230.

Output voltage conversion circuit 250 has: voltage dividing resistance 251 (for example, a resistance value of 100 MΩ) and voltage dividing resistance 252 (for example, a resistance value of 33 kΩ) which are configured to divide a DC high voltage output from rectifying circuit 230 (for example, 0 to 10 kV) into a low voltage (for example, 0 to 3.3 V); resistance 253 and capacitor 254 connected together in series between a node of these voltage dividing resistances 251 and 252 and ground GND, and capacitor 254; and op-amp 255 having a (+) input terminal connected to the node between resistance 253 and capacitor 254. Op-amp 255 has a configuration in which its (−) input terminal and output terminal are connected, and output voltage S250 output from this output terminal is supplied to ADC 102 in high voltage controller 100A.

(Configuration of Controller in Power Unit)

Figure 13:
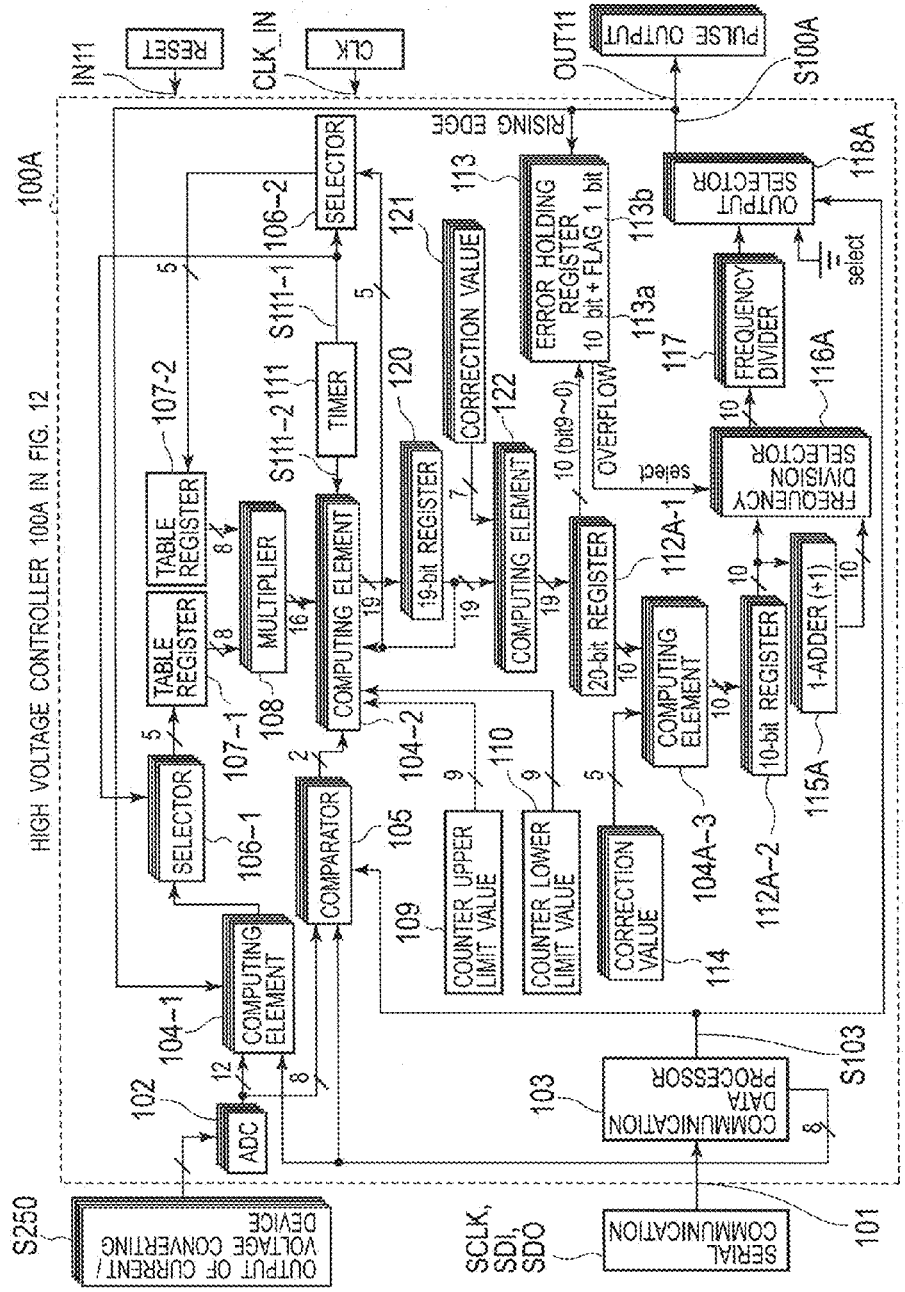
FIG. 13 is a configuration diagram showing high voltage controller 100A in FIG. 12.

FIG. 13 is a configuration diagram showing controller 100A in FIG. 12, and common reference numerals are given to components common to those in FIG. 6 showing high voltage controller 100 of the first embodiment.

In high voltage controller 100A of the second embodiment, 20-bit registers 112A-1, which are third frequency division ratio holding devices configured to hold third frequency division ratios, are provided instead of 19-bit registers 112-1 in high voltage controller 100 of the first embodiment. Between the input side of 20-bit registers 112A-1 and the I/O sides of computing elements 104-2, there are newly added: 19-bit registers 120 as first frequency division ratio holding devices configured to hold first frequency division ratios; correction value registers 121 configured to store first correction values; and computing elements 122 as first computing devices.

Furthermore, instead of 9-bit computing elements 104-3, 9-bit registers 112-2, 9-bit 1-adders 115, frequency division selectors 116, 9-bit frequency dividers 117, and output selectors 118 of the first embodiment, 10-bit computing elements 104A-3 as second computing devices, there are provided: 10-bit registers 112A-2 as second frequency division ratio holding devices configured to hold second frequency division ratios; 10-bit 1-adders 115A; frequency division selectors 116A; 10-bit frequency dividers 117A as frequency division devices; and output selectors 118A. A binarizing device configured to binarize the third frequency division ratio to determine the frequency division ratio of an integral value is formed of error holding register 113, 20-bit register 112A-1, computing element 104A-3, 10-bit register 112A-2, 1-adder 115A, and frequency division selector 116A. Other configurations are the same as those of the first embodiment.

The values of 19-bit registers 120 are updated by computing elements 104-2 connected to the input side thereof. Computing elements 104-2 and 122 are connected to the output side of 19-bit registers 120. 19-bit register 120 of the second embodiment differs from 19-bit register 112-1 of the first embodiment in that, in 19-bit register 120 of the second embodiment, the value is only updated by computing element 104-2 and there is no connection with error holding register 113. Correction value registers 121 are 7-bit registers, and configured to hold correction values of the respective channels of C, M, Y, and K. Correction value registers 121 are each formed of a nonvolatile memory or the like, and computing elements 122 are respectively connected to the output side of correction value registers 121.

Computing elements 122 are configured to multiply the values of 19-bit registers 120 by the 7-bit correction values of correction value registers 121, to truncate the lower 6 bits of the 26-bit values obtained as the multiplication result, and to input the higher 20 bits into 20-bit registers 112A-1. Moreover, 20-bit registers 112A-1 are registers configured to output the lower 10 bits of the input values to error holding registers 113 similar to those of the first embodiment, and to output the higher 10 bits thereof to computing elements 104A-3.

Computing elements 104A-3 are registers configured to add the 10-bit values output from 20-bit registers 112A-1 to 5-bit values as second correction values output from correction value registers 114 similar to those of the first embodiment, and to output the added results to 10-bit registers 112A-2. Except that the number of bits is 10 bits, computing element 104A-3 has the same function as computing element 104-3 of the first embodiment.

Moreover, 10-bit register 112A-2 is a register configured to hold the 10-bit value output from computing element 104A-3, and to output this value to 10-bit 1-adder 115A and frequency division selector 116A. Output selector 118A is connected to the output side of frequency division selector 116A through 10-bit frequency divider 117A. Except that the number of bits is 10 bits, 1-adder 115A, frequency division selector 116A, frequency divider 117A, and output selector 118A are also the same as those of the first embodiment.

Operation of Second Embodiment

In the second embodiment, the operation of image forming apparatus 1 in FIG. 3 and the operation of control circuit in FIG. 4 are the same as those of the first embodiment. Hereinafter, part of the operation which differs from the first embodiment is described.

First, the operation of power unit 80A shown in FIG. 10 is described.

Unlike the constant current control operation of the first embodiment, power unit 80A of the second embodiment performs constant voltage control operation.

Specifically, the DC high voltage output from rectifying circuit 230 is converted into output voltage S250 of DC 0 to 3.3 V by output voltage converting device 250, and is input into ADC 102 in high voltage controller 100A. High voltage controller 100A receives a K transfer bias, a Y transfer bias and an M transfer bias sent by serial communication device 61 of printer engine controller 60 and an 8-bit value equivalent to the output target voltage value of C transfer bias, and subsequently receives a bias ON command. The target output voltage is an 8-bit value, and 00 to FFhex is equivalent to 0 to 10.2 kV. The target output voltage is set at a 40V step.

A circuit formed of piezoelectric transformer 220, piezoelectric transformer drive circuit 210, and rectifying circuit 230 is configured such that an output voltage of 100 V to 7 kV can be obtained at a drive frequency of 130 to 108 kHz. A circuit formed of piezoelectric transformer 220A, piezoelectric transformer drive circuit 210, and rectifying circuit 230 is configured such that an output voltage of 100 V to 5 kV can be obtained at a drive frequency of 177 to 150 kHz.

While the target voltage indicating value transmitted as 8-bit data is 0 to 10 kV, piezoelectric transformer 220 for C charging bias output is limited to AFhex, i.e., an upper limit value of 7 kV, by firmware of printer engine controller 60.

This operation is described in detail by referring to FIG. 12.

In output voltage converting device 250, the output voltage divided by resistance 251 of a resistance value of 100 MΩ and resistance 252 of a resistance value of 33 kΩ is smoothed by a CR filter formed of resistance 253 and capacitor 254, and subjected to impedance conversion by op-amp 255. Output voltage S250 after this conversion is input into ADC 102.

Printer engine controller 60 synchronizes the transfer output voltage with serial clock SCK by a known serial communication, and transmits the transfer output voltage to high voltage controller 100A by serial data input signal SDI and serial data output signal SDO. For example, a K transfer output voltage is 3.0 kV, a Y transfer output voltage is 3.2 kV, an M transfer output voltage is 3.4 kV, and a C transfer output voltage is 3.6 kV. Because the transfer medium is charged every time transfer is repeated, in order to feed a necessary transfer current, the transfer output voltage is made higher toward downstream in the sheet conveying direction.

Next, the operation of high voltage controller 100A shown in FIG. 13 is described in detail.

Prior to the ON command of the transfer output voltage of each channel, by using serial communication device 61 for serial communication signals (SCK, SDI, SDO), printer engine controller 60 transmits the output voltage value to communication data processor 103 through serial communication device 61 in high voltage controller 100A by a pair of pieces of command data. At this time, printer engine controller 60 transmits, to communication data processor 103, an 8-bit value 4Bhex for 3.0 kV which is the K transfer voltage target value, a 8-bit value 50hex for 3.2 kV which is the Y transfer voltage target value, a 8-bit value 55hex for 3.4 kV which is the M transfer voltage target value, and a 8-bit value 5Ahex for 3.6 kV which is the C transfer voltage target value to communication data processor 103, respectively.

Communication data processor 103 receives the four pieces of 8-bit data transmitted thereto, and outputs the four pieces of 8-bit data to computing elements 104-1 and comparators 105. Computing element 104-1, comparator 105, timer 111, and selectors 106-1 and 106-2, table registers 107-1 and 107-2, multiplier 108, and computing element 104-2 perform control so that the 8-bit target value may be equal to the higher 12 bits of the detection value of ADC 102 in the same manner as in the case of the first embodiment.

The value of 19-bit register 120 is updated by computing element 104-2, and the updated 19-bit value is output to computing element 122. This 19-bit value is output to computing element 104-2 and selector 106-2 similarly to the case of 19-bit register 112-1 of the first embodiment. Computing element 122 multiplies the value of 19-bit register 120, the initial value of which is 60000hex for the four channels, by the 7-bit correction value of correction value register 121, truncates the lower 6 bits of the multiplication result, and sets the 20-bit value thereof to 20-bit register 112A-1.

As the correction values of correction registers 121, C has 40hex and the remaining three channels have 2Fhex. As the 26-bit values after the multiplication by computing elements 122, C has 1800000hex and the remaining 3 colors have 11A0000. When the 26-bit values are shifted by 6 bits and truncated, C has 60000hex and the remaining three have 46800hex. As the higher 10 bits, C has 180hex and the remaining 3 colors have 11Ahex.

C has a set value of 130.2 Hz, and M, Y, and K each have a set value of 177.3 kHz. Similarly to the first embodiment, the correction value of correction value register 114 is subtracted from or added to the value by computing element 104A-3. Driving pulse S100A is output from output selector 118A through 10-bit register 112A-2, 1-adder 115A, frequency division selector 116A, and frequency divider 117A. Thereafter, similarly to the first embodiment, the frequency is controlled so as to be the detection value of ADC 102 corresponding to the target voltage value.

Effect of Second Embodiment

According to the second embodiment, the configuration is such that the frequencies to drive piezoelectric transformers 220 and 220A can be greatly changed with magnification. For this reason, in the case of using piezoelectric transformers 220 and 220A having production variation and also differing from each other in size and frequency characteristics, by using a common logical circuit and properly selecting an optimal correction data, a high output voltage in the vicinity of the resonance frequency and output starting in a short time are possible simultaneously.

Other Modifications

The invention is not limited to the first and second embodiments and modifications thereof, and other modifications can be made as follows.

While image forming apparatus 1 of a color tandem type is described in the embodiments, the invention can be applied to monochrome or the like image forming apparatuses in addition to color image forming apparatuses, and other image forming apparatuses such as multifunction machines. Moreover, power units 80 and 80A can be applied to other high voltage power supplies other than those for transfer or for charging.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A power unit comprising:
   an oscillator configured to generate a clock signal;
   a frequency division device configured to divide the clock signal in a second frequency division ratio based on a first frequency division ratio and to output a driving pulse;
   a switching device driven by the driving pulse;
   a piezoelectric transformer configured to output an alternating-current high voltage from a secondary side thereof when a voltage is intermittently applied to a primary side thereof by the switching device;
   a converting device configured to convert an analog signal corresponding to the high voltage output of the piezoelectric transformer into a digital signal and to output the digital signal;
   a comparison device configured to compare the digital signal with a target voltage set for the high voltage output of the piezoelectric transformer and to output a comparison result;
   a controller configured to control the first frequency division ratio on the basis of the comparison result;
   a first frequency division ratio holding device configured to hold the first frequency division ratio controlled by the controller;
   a first computing device configured to determine the second frequency division ratio by performing computation using a first correction value and the first frequency division ratio held by the first frequency division ratio holding device; and
   a second frequency division ratio holding device configured to hold the second frequency division ratio determined by the first computing device.

2. The power unit according to claim 1, wherein the controller includes a first gain switching device according to a frequency value, the first gain switching device configured to increase or decrease a unit to change a value of the first frequency division ratio held by the first frequency division ratio holding device, in accordance with the value of the first frequency division ratio.

3. A power unit comprising
   a plurality of the power units according to claim 2, wherein the first gain switching device provided in each of the plurality of the power units is configured to be shared by the plurality of power units at different times.

4. The power unit according to claim 1, wherein the controller includes a second switching gain device according to a value of the comparison result, the second gain switching device configured to increase or decrease a unit to change a value of the first frequency division ratio held by the first frequency division ratio holding device, in accordance with the value of the comparison result.

5. A power unit comprising
a plurality of the power units according to claim 4, wherein
the second gain switching device provided in each of the plurality of the power units is configured to be shared by the plurality of the power units at different times.

6. The power unit according to claim 1, wherein
the controller includes:
a first gain switching device according to a frequency value, the first gain switching device configured to increase or decrease a unit to change a value of the first frequency division ratio held by the first frequency division ratio holding device, in accordance with the value of the first frequency division ratio; and
a second switching gain device according to a value of the comparison result, the second gain switching device configured to increase or decrease a unit to change the value of the first frequency division ratio held by the first frequency division ratio holding device, in accordance with the value of the comparison result.

7. The power unit according to claim 6, further comprising a multiplying device configured to multiply a value of the first gain switching device by a value of the second gain switching device to update the first frequency division ratio held by the first frequency division ratio holding device.

8. A power unit comprising
a plurality of the power units according to claim 6, wherein
the first and second gain switching devices provided in each of the plurality of the power units are configured to be shared by the plurality of the power units at different times.

9. The power unit according to claim 1, wherein
the first division ratio holding device holds an integral value of the first frequency division ratio, and
the first computing device determines the second frequency division ratio by adding or subtracting the first correction value to or from the integral value held by the first frequency division ratio holding device.

10. The power unit according to claim 1, wherein
the first division ratio holding device holds a real value of the first frequency division ratio, and
the first computing device determines the second frequency division ratio by multiplying or dividing the real value held by the first frequency division ratio holding device by the first correction value.

11. The power unit according to claim 1, wherein the controller compares an upper limit value of the first frequency division ratio holdable by the first frequency division ratio holding device to a holding value of the first frequency division ratio holding device, and performs control in such a way that the holding value of the first frequency division ratio holding device does not exceed the upper limit value.

12. The power unit according to claim 1, wherein the controller compares a lower limit value of the first frequency division ratio holdable by the first frequency division ratio holding device to a holding value of the first frequency division ratio holding device, and performs control in such a way that the holding value of the first frequency division ratio holding device does not fall below the lower limit value.

13. An image forming apparatus comprising the power unit according to claim 1.

14. A power unit comprising:
an oscillator configured to generate a clock signal;
a frequency division device configured to divide the clock signal in a second frequency division ratio based on a real-valued first frequency division ratio and to output a driving pulse;
a switching device driven by the driving pulse;
a piezoelectric transformer configured to output an alternating-current high voltage from a secondary side thereof when a voltage is intermittently applied to a primary side thereof by the switching device;
a converting device configured to convert an analog signal corresponding to the high voltage output of the piezoelectric transformer into a digital signal and to output the digital signal;
a comparison device configured to compare the digital signal with a target voltage set for the high voltage output of the piezoelectric transformer and to output a comparison result;
a controller configured to control the first frequency division ratio on the basis of the comparison result;
a first frequency division ratio holding device configured to hold the real-valued first frequency division ratio controlled by the controller;
a first computing device configured to determine a third frequency division ratio by multiplying or dividing the real-valued first frequency division ratio held by the first frequency division ratio holding device by a first correction value;
a binarizing device configured to determine an integer-valued frequency division ratio by binarizing the third frequency division ratio; and
a second computing device configured to determine the second frequency division ratio by adding or subtracting a second correction value to or from the integer-valued division ratio.

* * * * *

UNITED STATES PATENT AND TRADEMARK OFFICE
CERTIFICATE OF CORRECTION

PATENT NO. : 8,350,550 B2  Page 1 of 1
APPLICATION NO. : 12/861975
DATED : January 8, 2013
INVENTOR(S) : Toru Kosaka It is certified that error appears in the above-identified patent and that said Letters Patent is hereby corrected as shown below:

Title Page, item (54) and Column 1, line 1, is

Incorrect: POWER UNIT USING COMPUTED FREQUENCY RATIO AND IMAGE FORMING APPARATUS Correct: POWER UNIT USING COMPUTED FREQUENCY DIVISION RATIO AND IMAGE FORMING APPARATUS Signed and Sealed this
Nineteenth Day of February, 2013

Teresa Stanek Rea
*Acting Director of the United States Patent and Trademark Office*